US009170033B2

United States Patent
Kroyzer

(10) Patent No.: US 9,170,033 B2
(45) Date of Patent: Oct. 27, 2015

(54) METHOD AND APPARATUS FOR OPERATING A SOLAR ENERGY SYSTEM TO ACCOUNT FOR CLOUD SHADING

(75) Inventor: Gil Kroyzer, Jerusalem (IL)

(73) Assignee: BRIGHTSOURCE INDUSTRIES (ISRAEL) LTD., Jerusalem (IL)

( * ) Notice: Subject to any disclaimer, the term of this patent is extended or adjusted under 35 U.S.C. 154(b) by 1259 days.

(21) Appl. No.: 13/010,608

(22) Filed: Jan. 20, 2011

(65) Prior Publication Data

US 2011/0220091 A1 Sep. 15, 2011

Related U.S. Application Data

(60) Provisional application No. 61/296,821, filed on Jan. 20, 2010.

(51) Int. Cl.
*F03G 6/00* (2006.01)
*F24J 2/40* (2006.01)
(Continued)

(52) U.S. Cl.
CPC .... *F24J 2/40* (2013.01); *F24J 2/38* (2013.01); *H01L 31/0547* (2013.01); *F24J 2002/0084* (2013.01); *F24J 2002/385* (2013.01); *Y02E 10/47* (2013.01); *Y02E 10/52* (2013.01)

(58) Field of Classification Search
CPC .................. F24J 2/38; F24J 2/40; F24J 2/00; F22B 1/006; F22B 35/00; Y02E 10/46; Y02E 10/47
USPC .................... 60/641.8–641.15; 126/569–713; 136/243–251
IPC .......................................................... F24J 2/38
See application file for complete search history.

(56) References Cited

U.S. PATENT DOCUMENTS

| 2,999,943 A | 9/1961 | Willard |
| 3,892,433 A | 7/1975 | Blake |

(Continued)

FOREIGN PATENT DOCUMENTS

| DE | 10248068 | 5/2004 |
| EP | 0106688 | 3/1985 |

(Continued)

OTHER PUBLICATIONS

Lopez-Martinez et al., "Vision-based System for the Safe Operation of a Solar Power Tower Plant," Iberamia, 2002, LNAI 2527:pp. 943-952.*

(Continued)

*Primary Examiner* — Thomas Denion
*Assistant Examiner* — Kelsey Stanek
(74) *Attorney, Agent, or Firm* — Miles & Stockbridge P.C.; Mark A. Catan

(57) ABSTRACT

Images representative of cloud shadows with respect to a field of heliostats can be used to adjust operation of a solar energy system. For example, images of a field of heliostats and shadows produced by the clouds can be obtained. Additionally or alternatively, images of the sky and clouds can be obtained. The images can be analyzed to determine a shading parameter. Based on the shading parameter, an operating parameter of the solar energy system can be changed or maintained. For example, the operating parameter may include aiming directions for one or more of the heliostats. Cloud characteristics in addition to the location of the cloud shadow can be used in determining the shading parameter. Such characteristics can be used in determining if and/or how to change the operating parameter of the solar energy system.

8 Claims, 17 Drawing Sheets

(51) Int. Cl.
*F24J 2/38* (2014.01)
*H01L 31/054* (2014.01)
*F24J 2/00* (2014.01)

(56) References Cited

U.S. PATENT DOCUMENTS

| | | | |
|---|---|---|---|
| 3,924,604 A | 12/1975 | Anderson | |
| 4,034,735 A | 7/1977 | Waldrip | |
| 4,044,753 A | 8/1977 | Fletcher et al. | |
| 4,102,326 A | 7/1978 | Sommer | |
| 4,117,682 A | 10/1978 | Smith | |
| 4,146,785 A | 3/1979 | Neale | |
| 4,172,443 A | 10/1979 | Sommer | |
| 4,219,729 A | 8/1980 | Smith | |
| 4,227,513 A | 10/1980 | Blake et al. | |
| 4,245,618 A | 1/1981 | Wiener | |
| 4,247,182 A | 1/1981 | Smith | |
| 4,265,223 A | 5/1981 | Miserlis et al. | |
| 4,283,887 A | 8/1981 | Horton et al. | |
| 4,289,114 A | 9/1981 | Zadiraka | |
| 4,296,730 A | 10/1981 | Zadiraka | |
| 4,297,521 A | 10/1981 | Johnson | |
| 4,320,663 A | 3/1982 | Francia | |
| 4,331,829 A | 5/1982 | Palazzetti et al. | |
| 4,343,182 A | 8/1982 | Pompei | |
| 4,365,617 A | 12/1982 | Bugash et al. | |
| 4,365,618 A | 12/1982 | Jones | |
| 4,438,630 A | 3/1984 | Rowe | |
| 4,459,972 A | 7/1984 | Moore | |
| 4,474,169 A | 10/1984 | Steutermann | |
| 4,476,853 A | 10/1984 | Arbogast | |
| 4,485,803 A | 12/1984 | Wiener | |
| 4,490,981 A | 1/1985 | Meckler | |
| 4,512,336 A | 4/1985 | Wiener | |
| 4,564,275 A | 1/1986 | Stone | |
| 4,633,854 A | 1/1987 | Mayrhofer | |
| 4,665,706 A | 5/1987 | Russell et al. | |
| 4,887,431 A | 12/1989 | Peet | |
| 4,913,129 A | 4/1990 | Kelly et al. | |
| 4,979,493 A | 12/1990 | Seidel | |
| 5,128,799 A | 7/1992 | Byker | |
| 5,417,052 A | 5/1995 | Bharathan et al. | |
| 5,578,140 A | 11/1996 | Yogev et al. | |
| 5,759,251 A | 6/1998 | Nakamura et al. | |
| 5,861,947 A | 1/1999 | Neumann | |
| 5,862,799 A | 1/1999 | Yogev et al. | |
| 5,867,989 A | 2/1999 | Platell | |
| 5,899,199 A | 5/1999 | Mills | |
| 5,905,590 A | 5/1999 | Van Der Sluis et al. | |
| 5,982,481 A | 11/1999 | Stone et al. | |
| 6,080,927 A | 6/2000 | Johnson | |
| 6,131,565 A | 10/2000 | Mills | |
| 6,310,725 B1 | 10/2001 | Duine et al. | |
| 6,597,709 B1 | 7/2003 | Diver, Jr. | |
| 6,653,551 B2 | 11/2003 | Chen | |
| 6,662,801 B2 | 12/2003 | Hayden et al. | |
| 6,818,818 B2 | 11/2004 | Bareis | |
| 6,899,097 B1 | 5/2005 | Mecham | |
| 6,926,440 B2 | 8/2005 | Litwin | |
| 6,957,536 B2 | 10/2005 | Litwin et al. | |
| 6,959,993 B2 | 11/2005 | Gross et al. | |
| 811,274 A1 | 1/2006 | Carter | |
| 7,042,615 B2 | 5/2006 | Richardson | |
| 7,191,597 B2 | 3/2007 | Goldman | |
| 7,191,736 B2 | 3/2007 | Goldman | |
| 7,207,327 B2 | 4/2007 | Litwin et al. | |
| 7,296,410 B2 | 11/2007 | Litwin | |
| 7,331,178 B2 | 2/2008 | Goldman | |
| 7,340,899 B1 | 3/2008 | Rubak et al. | |
| 7,523,921 B2 | 4/2009 | Garrity | |
| 7,884,279 B2 | 2/2011 | Dold et al. | |
| 8,001,960 B2 * | 8/2011 | Gilon et al. | 126/600 |
| 8,033,110 B2 | 10/2011 | Gilon et al. | |
| 8,063,349 B2 | 11/2011 | Huss et al. | |
| 8,573,196 B2 | 11/2013 | Plotkin et al. | |
| 8,627,664 B2 | 1/2014 | Katz et al. | |
| 8,655,498 B2 | 2/2014 | Bronicki | |
| 2004/0086021 A1 | 5/2004 | Litwin | |
| 2004/0231716 A1 | 11/2004 | Litwin | |
| 2005/0126170 A1 | 6/2005 | Litwin | |
| 2005/0150230 A1 | 7/2005 | Rollins | |
| 2007/0084208 A1 | 4/2007 | Goldman | |
| 2007/0157614 A1 | 7/2007 | Goldman | |
| 2007/0157922 A1 | 7/2007 | Radhakrishnan et al. | |
| 2007/0221208 A1 | 9/2007 | Goldman | |
| 2007/0272234 A1 | 11/2007 | Allen et al. | |
| 2008/0000436 A1 | 1/2008 | Goldman | |
| 2008/0011288 A1 | 1/2008 | Olsson | |
| 2008/0011290 A1 | 1/2008 | Goldman et al. | |
| 2008/0029150 A1 | 2/2008 | Quero et al. | |
| 2008/0293132 A1 | 11/2008 | Goldman et al. | |
| 2008/0295883 A1 | 12/2008 | Ducellier et al. | |
| 2008/0314438 A1 | 12/2008 | Tran et al. | |
| 2009/0038608 A1 | 2/2009 | Caldwell | |
| 2009/0056701 A1 | 3/2009 | Mills et al. | |
| 2009/0107485 A1 | 4/2009 | Reznik et al. | |
| 2009/0121495 A1 | 5/2009 | Mills | |
| 2009/0151769 A1 | 6/2009 | Corbin | |
| 2009/0165780 A1 | 7/2009 | Ota | |
| 2009/0178668 A1 | 7/2009 | Boggavarapu | |
| 2009/0217921 A1 * | 9/2009 | Gilon et al. | 126/600 |
| 2009/0229264 A1 | 9/2009 | Gilon et al. | |
| 2009/0249787 A1 * | 10/2009 | Pfahl et al. | 60/641.11 |
| 2009/0250052 A1 * | 10/2009 | Gilon et al. | 126/684 |
| 2009/0260619 A1 | 10/2009 | Bailey et al. | |
| 2010/0006087 A1 | 1/2010 | Gilon et al. | |
| 2010/0139644 A1 | 6/2010 | Schwarzbach et al. | |
| 2010/0191378 A1 | 7/2010 | Gilon et al. | |
| 2010/0198420 A1 | 8/2010 | Rettger et al. | |
| 2010/0236239 A1 | 9/2010 | Kroizer et al. | |
| 2010/0263709 A1 | 10/2010 | Norman et al. | |
| 2010/0282242 A1 | 11/2010 | Gilon et al. | |
| 2010/0300510 A1 | 12/2010 | Goldman et al. | |
| 2011/0036343 A1 | 2/2011 | Kroyzer et al. | |
| 2011/0067750 A1 | 3/2011 | Ueda | |
| 2011/0088339 A1 | 4/2011 | McCarthy | |
| 2011/0088396 A1 * | 4/2011 | Katz et al. | 60/641.8 |
| 2011/0153095 A1 | 6/2011 | Rock et al. | |
| 2012/0024282 A1 | 2/2012 | Gilon et al. | |
| 2012/0090323 A1 | 4/2012 | Gonzales et al. | |
| 2012/0227401 A1 * | 9/2012 | Katz et al. | 60/641.15 |
| 2013/0133641 A1 | 5/2013 | Shvets | |
| 2013/0345996 A1 | 12/2013 | Satoh et al. | |
| 2014/0026566 A1 | 1/2014 | Katz et al. | |

FOREIGN PATENT DOCUMENTS

| | | |
|---|---|---|
| JP | 56-102646 | 8/1981 |
| WO | WO 2004/004016 | 1/2004 |
| WO | WO 2004/067933 | 8/2004 |
| WO | WO 2007/118223 | 10/2007 |
| WO | WO 2008/092194 | 8/2008 |
| WO | WO 2008/092195 | 8/2008 |
| WO | WO 2008/114248 | 9/2008 |
| WO | WO 2008/118980 | 10/2008 |
| WO | WO 2008/128237 | 10/2008 |
| WO | WO 2008/154599 | 12/2008 |
| WO | WO 2009/015219 | 1/2009 |
| WO | WO 2009/015388 | 1/2009 |
| WO | WO 2009/021099 | 2/2009 |
| WO | WO 2009/055624 | 4/2009 |
| WO | WO 2009/070774 | 6/2009 |
| WO | WO 2009/103077 | 8/2009 |
| WO | WO 2009/131787 | 10/2009 |
| WO | WO 2011/064718 | 6/2011 |
| WO | WO 2011/140021 | 11/2011 |
| WO | WO 2012/014153 | 2/2012 |

OTHER PUBLICATIONS

BCB Informatica y Control. Heliostat Calibration for Concentrating Solar Power Plants Using Machine Vision [online]. [retrieved on Nov. 17, 2009]. Retrieved from the Internet: <URL: http://bcb.es/documentos/descargar.php?id=29>.

(56) References Cited

OTHER PUBLICATIONS

"Central Receiver Systems" in: Stine, W.B., and Geyer, M., Power from the Sun [online], 2001 [retrieved on Nov. 17, 2009]. Retrieved from the Internet: <URL: http://www.powerfromthesun.net/Chapter10/Chapter10new.htim>, Chapter 10.

Cohen et al., "Final Report on the Operation and Maintenance Improvement Project for Concentrating Solar Power Plants," SAND99-1290 [online], Jun. 1999 [retrieved on May 16, 2012]. Retrieved from the Internet: <URL: http://infohouse.p2ric.org/ref/17/16933/1693301.pdf>.

"Mean and Peak Wind Load Reduction on Heliostats," Colorado State University, Solar Energy Research Institute, U.S. Department of Energy [online], Sep. 1987 [retrieved on May 16, 2012]. Retrieved from the Internet: <URL: http://www.nrel.gov/docs/legosti/old/3212.pdf>.

Meduri et al., "Performance Characterization and Operation of Esolar's Sierra Suntower Power Tower Plant," SolarPACES 2010 Conference, Sep. 21-24, 2010, Perpignan, France.

Mills et al., "Multi-Tower Solar Array Project," *Proceedings of the Solar Harvest Conference, 40th Annual ANZSES Conference*, 2002.

Peterka et al., "Wind Load Reduction for Heliostats," Solar Energy Research Institute, U.S. Department of Energy [online], May 1986 [retrieved on May 16, 2012]. Retrieved from the Internet: <URL: http://www.nrel.gov/docs/legosti/old/2859.pdf>.

Phipps, Gary S., "Heliostat Beam Characterization System Calibration Technique," U.S. Department of Commerce, National Technical Information Service, Sandia Labs, SAND791532C, 1979.

Pottler et al., "Photogrammetry: A Powerful Tool for Geometric Analysis of Solar Concentrators and Their Components," Journal of Solar Energy Engineering, Feb. 2005, 127(1): pp. 94-101.

Rabl, A., "Tower Reflector for Solar Power Plan," *Solar Energy*, 1976, 18: pp. 269-271.

Roschke, E.J., "Wind Loading on Solar Concentrators: Some General Considerations," Jet Propulsion Laboratory, National Aeronautics and Space Administration, U.S. Department of Energy [online], May 1984 [retrieved May 16, 2012]. Retrieved from the Internet: <URL: http://ntrs.nasa.gov/archive/nasa/casi.ntrs.nasa.gov/19840024844_1984024844.pdf>.

Shortis et al., "Photogrammetric Analysis of Solar Concentrators," Proceedings of the 12th Australian Remote Sensing and Photogrammetry Conference, Fremantle, Australia, 2004, pp. 1-10.

Slack et al., "Esolar Power Tower Performance Modeling and Experimental Validation," SolarPACES 2010 Conference, Sep. 21-24, 2010, Perpignan, France.

Stone, K.W., and Jones, S.A., "Analysis of Solar Two Heliostat Tracking Error Sources," Sandia National Laboratories, Report No. SAND99-0239C, Jan. 28, 1999.

Strachan, J.W. and Houser, R.M., "Testing and Evaluation of Large-Area Heliostats for Solar Thermal Applications," Solar Thermal Test Department, Sandia National Laboratories, SAND92-1381, Feb. 1993.

Vant-Hull, L.L., and Pitman, C.L., "Static and Dynamic Response of a Heliostat Field to Flux Density Limitations on a Central Receiver," *Solar Engineering*, 1990, pp. 31-38.

\* cited by examiner

METHOD AND APPARATUS FOR OPERATING A SOLAR ENERGY SYSTEM TO ACCOUNT FOR CLOUD SHADING

CROSS-REFERENCE TO RELATED APPLICATIONS

The present application claims the benefit of U.S. Provisional Application No. 61/296,821, filed Jan. 20, 2010, which is hereby incorporated by reference herein in its entirety.

FIELD

The present disclosure relates generally to solar energy systems, and, more particularly, to operating a solar energy system to account for cloud shading.

SUMMARY

Embodiments of the present disclosure relate to systems, methods, and devices for operating a solar energy system to account for shading of heliostats. Images representative of cloud shadows with respect to a field of heliostats can be used to adjust operation of a solar energy system. For example, images of a field of heliostats and shadows produced by the clouds can be obtained. Additionally or alternatively, images of the sky and clouds can be obtained. The images can be analyzed to determine a shading parameter. Based on the shading parameter, an operating parameter of the solar energy system can be changed or maintained. For example, the operating parameter may include aiming directions for one or more of the heliostats. Cloud characteristics in addition to the location of the cloud shadow can be used in determining the shading parameter. Such characteristics can be used in determining if and/or how to change the operating parameter of the solar energy system.

In embodiments, a method of operating a solar energy system having a field of heliostats can include acquiring at least one image of at least a portion of the field of heliostats. The method can further include determining a first sub-portion of the field of heliostats shaded by one or more clouds based on the at least one image. Based on the determining, an aiming direction of one or more of the heliostats outside of the first sub-portion can be changed.

In embodiments, a method of operating a solar energy system having a field of heliostats can include acquiring at least one image of a shadow cast by a cloud. The method can further include determining a shading parameter of said cloud based on the at least one image. Based on the shading parameter, an operating parameter of the solar energy system can be changed.

In embodiments, a method of operating a solar energy system having a field of heliostats can include acquiring at least one image representative of a shadow cast by a cloud. The method can further include determining a shading parameter of said cloud based on the at least one image. The solar energy system can be operated based at least in part on the shading parameter.

Objects and advantages of embodiments of the present disclosure will become apparent from the following description when considered in conjunction with the accompanying drawings.

BRIEF DESCRIPTION OF THE DRAWINGS

Embodiments will hereinafter be described with reference to the accompanying drawings, which have not necessarily been drawn to scale. Where applicable, some features may not be illustrated to assist in the illustration and description of underlying features. Throughout the figures, like reference numerals denote like elements.

DETAILED DESCRIPTION

Embodiments of the present disclosure relate generally to solar energy systems that include at least one solar field, e.g., one or more apparatus for redirecting insolation toward a solar target. Solar targets can be configured to convert insolation into another form of energy, e.g., electricity (for example, by using photovoltaic cells), thermal energy (for example, by using sun solar thermal systems), or biofuels. The one or more solar fields may have different footprints or geometries. For example, a plurality of heliostat-mounted mirrors (referred to herein as heliostats) can track the sun to reflect incident sunlight onto a solar target, for example, at or near the top of a solar tower.

Figure 1:
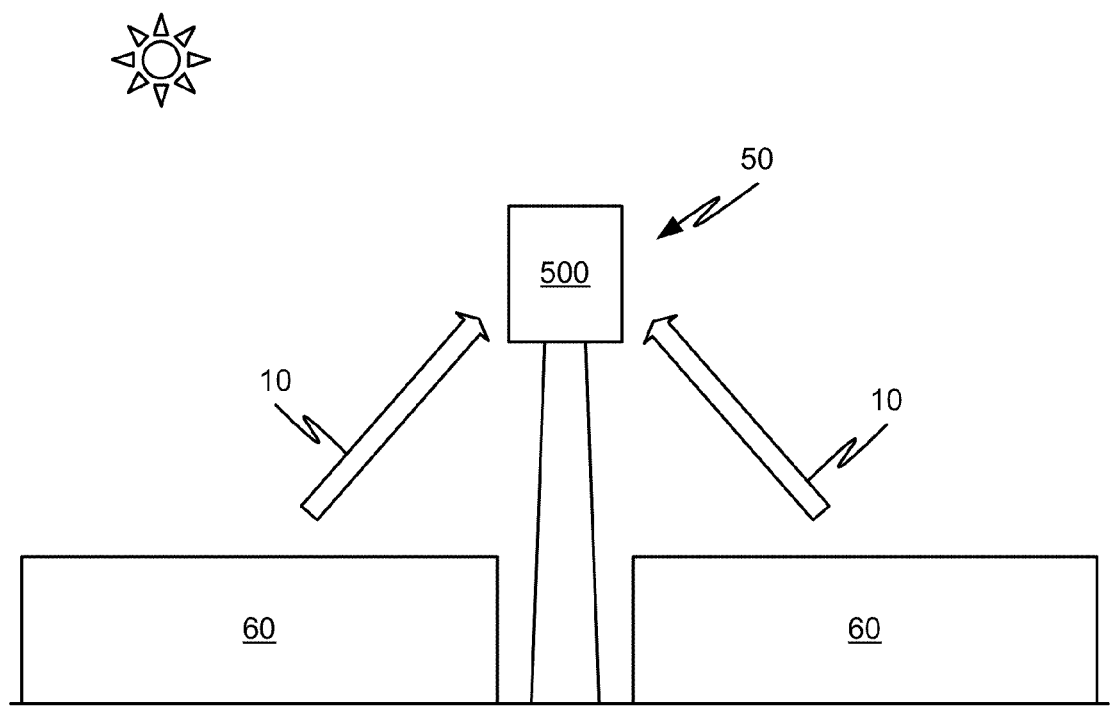
FIG. 1 shows a solar power tower system, according to one or more embodiments of the disclosed subject matter.
Figure 2:
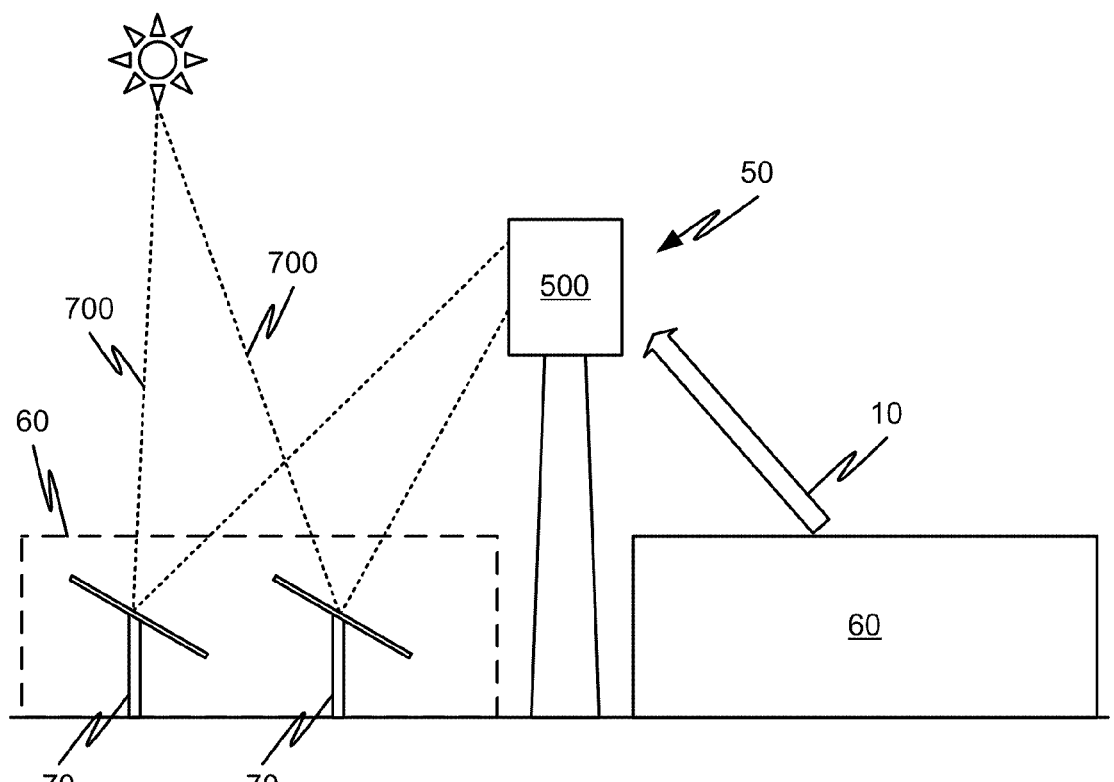
FIG. 2 shows a solar power tower system illustrating individual heliostats, according to one or more embodiments of the disclosed subject matter.

Embodiments of solar tower systems are shown in FIGS. 1-5. In embodiments, incident solar radiation can be used by the solar tower systems to generate solar steam and/or for heating molten salt. In FIG. 1, a solar tower system can include a solar tower 50 that receives reflected focused sunlight 10 from a solar field 60 of heliostats (individual heliostats 70 are illustrated in FIG. 2). Mounted in or on the solar tower 50 is a solar energy receiver system 500, which can include one or more individual receivers. The solar receivers can be constructed to heat water and/or steam and/or supercritical steam and/or another type of heat transfer fluid using insolation received from the heliostats. For example, the solar tower 50 can have a dimension of at least 25 meters, at least 50 meters, at least 75 meters, or even higher.

With reference to FIG. 2, individual heliostats 70 are shown. The heliostats 70 can be aimed at solar energy receiver system 500, for example, a solar energy receiving surface of one or more receivers of system 500. Lines 700A, 700B represent optical paths for beams of sunlight reflected by heliostats 70 onto the solar energy receiver system. Heliostats 70 can adjust their orientation to track the sun as it moves across the sky, thereby continuing to reflect sunlight onto one or more aiming points associated with the solar energy receiver system 500.

Figure 3:
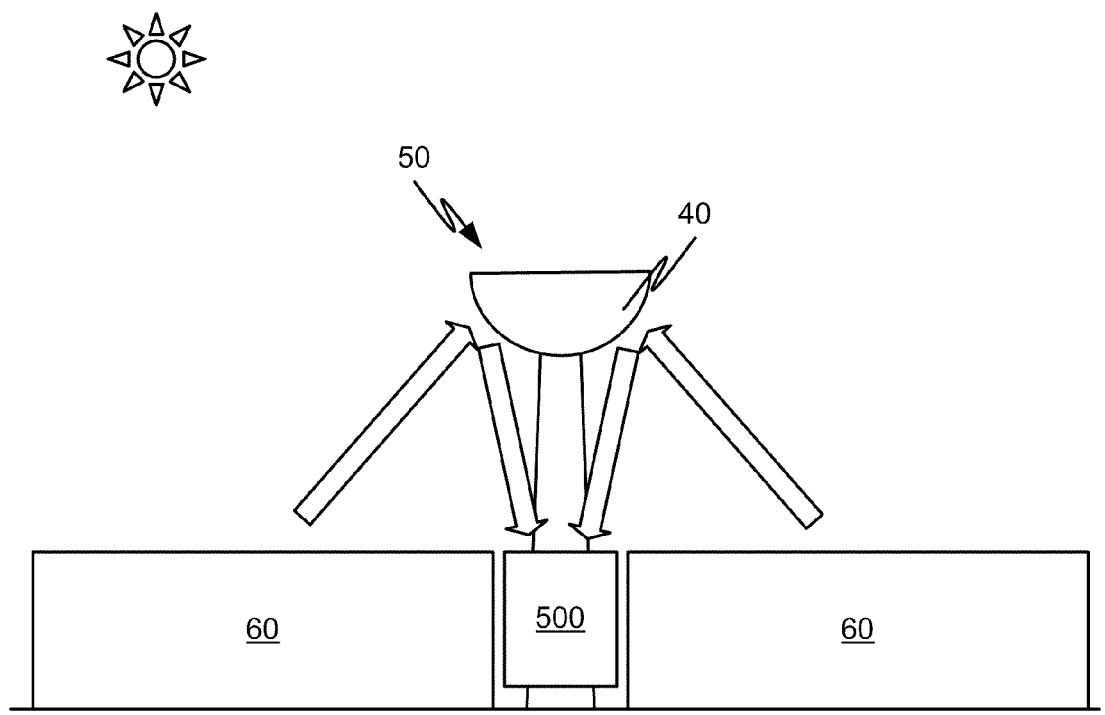
FIG. 3 shows another solar power tower system with secondary reflector, according to one or more embodiments of the disclosed subject matter.

The solar energy receiver system 500 can be arranged at or near the top of tower 50, as shown in FIGS. 1-2. In another embodiment, a secondary reflector 40 can be arranged at or near the top of a tower 50, as shown in FIG. 3. The secondary reflector 40 can thus receive the insolation from the field of heliostats 60 and redirect the insolation (e.g., through reflection) toward a solar energy receiver system 500. The solar energy receiver system 500 can be arranged within the field of heliostats 60, outside of the field of heliostats 60, at or near ground level, at or near the top of another tower 50, above or below reflector 40, or elsewhere.

More than one solar tower 50 can be provided, each with a respective solar energy receiving system thereon, for example, a solar power steam system. The different solar energy receiving systems may have different functionalities. For example, one of the solar energy receiving systems may heat water using the reflected solar radiation to generate steam while another of the solar energy receiving systems may serve to superheat steam using the reflected solar radiation. The multiple solar towers 50 may share a common heliostat field 60 or have respective separate heliostat fields. Some of the heliostats may be constructed and arranged so as to alternatively direct insolation at solar energy receiving systems in different towers. In addition, the heliostats may be configured to direct insolation away from any of the towers, for example, during a dumping condition.

Figure 4:
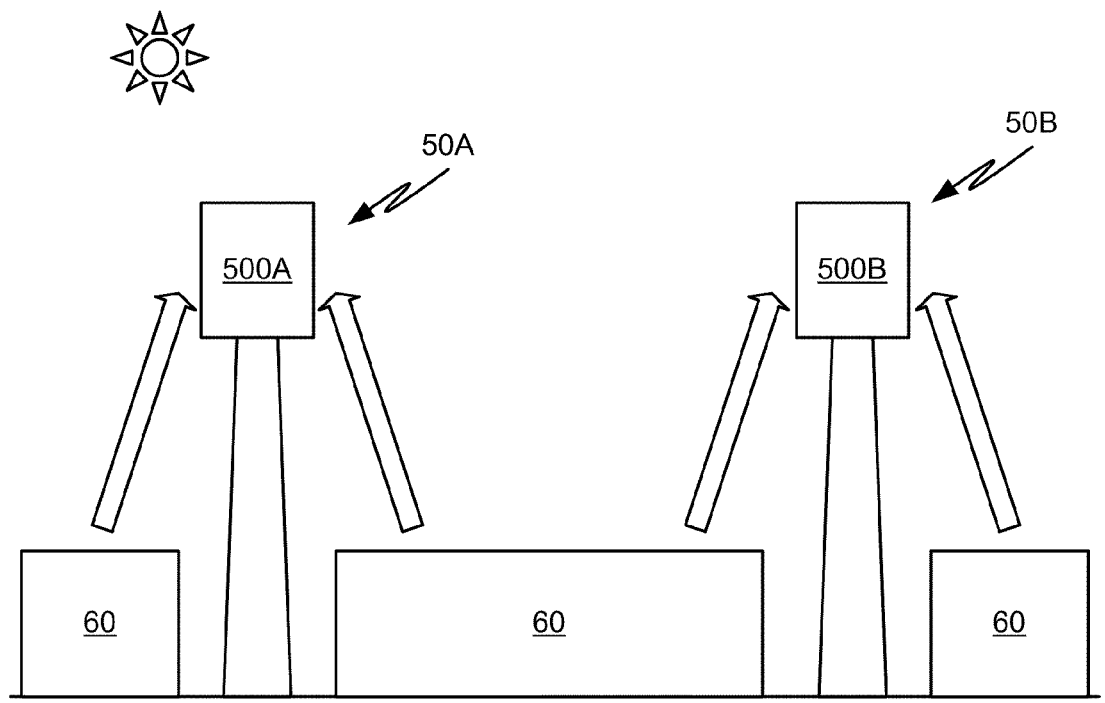
FIG. 4 shows a solar power tower system including multiple towers, according to one or more embodiments of the disclosed subject matter.

For example, in the embodiment of FIG. 4, two solar towers are provided, each with a respective solar energy receiving system. A first tower 50A has a first solar energy receiving system 500A while a second tower 50B has a second solar energy receiving system 500B. The solar towers 50A, 50B are arranged so as to receive reflected solar radiation from a common field of heliostats 60. At any given time, a heliostat within the field of heliostats 60 may be directed to a solar receiver of any one of the solar towers 50A, 50B. Although only two solar towers with respective solar energy receiving systems are shown in FIG. 4, any number of solar towers and solar energy receiving systems can be used.

More than one solar receiver can be provided on a solar tower. The multiple solar receivers in combination may form a part of the solar energy receiving system. The different solar receivers may have different functionalities. For example, one of the solar receivers may heat water using the reflected solar radiation to generate steam while another of the solar receivers may serve to superheat steam using the reflected solar radiation. The multiple solar receivers can be arranged at different heights on the same tower or at different locations (e.g., different faces, such as a north face, a west face, etc.) on the same tower. Some of the heliostats in field 60 may be constructed and arranged so as to alternatively direct insolation at the different solar energy receiving systems.

Figure 5:
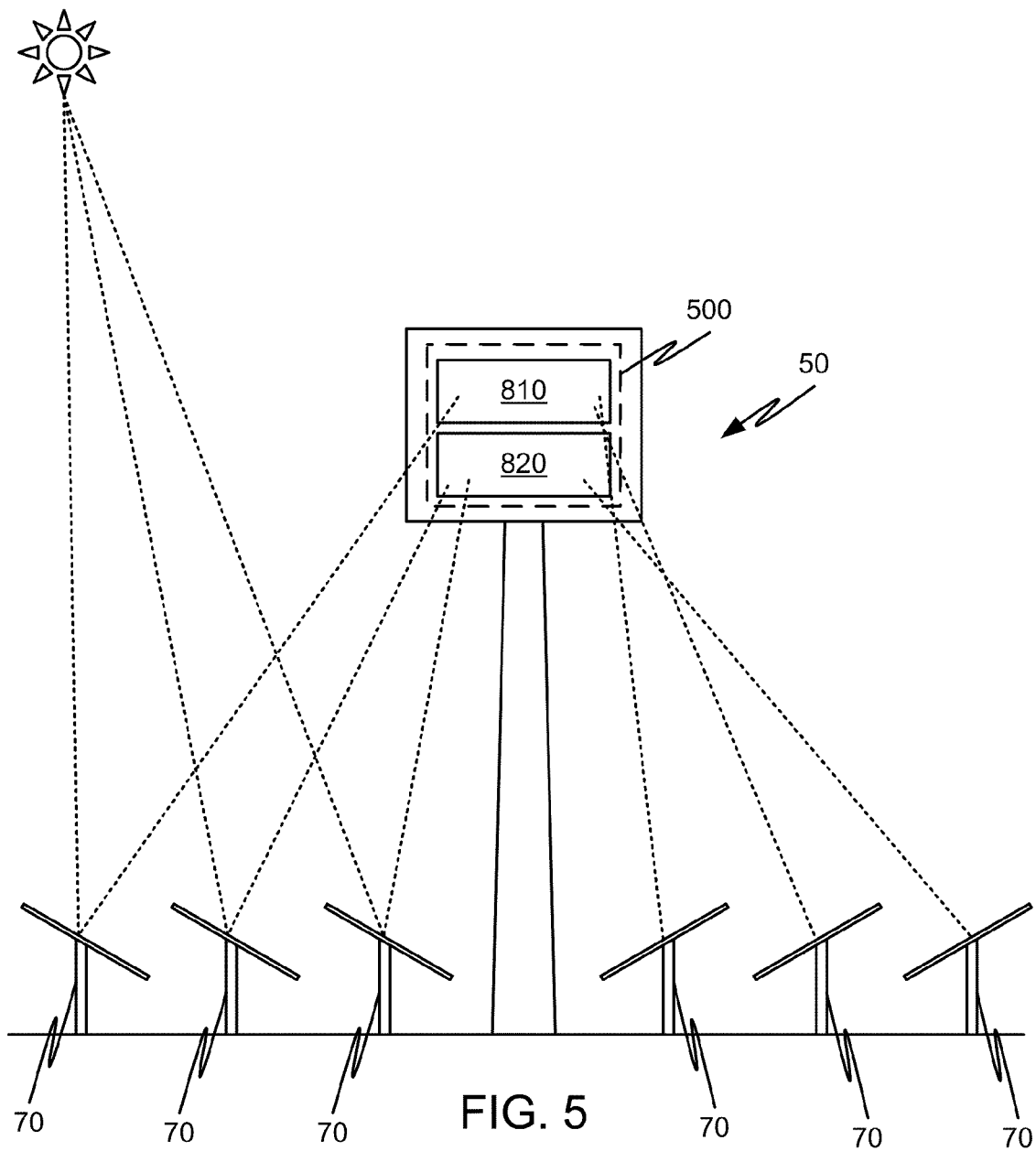
FIG. 5 shows a solar power tower system including multiple receivers in a single tower, according to one or more embodiments of the disclosed subject matter.

For example, in the embodiment of FIG. 5, two solar receivers are provided on a single tower 50. The solar energy receiving system 500 thus includes a first solar receiver 810 and a second solar receiver 820. At any given time, a heliostat 70 may be aimed at one or both of the solar receivers, or at none of the receivers. In some use scenarios, the aim of a heliostat 70 may be adjusted so as to move a centroid of the reflected beam projected at the tower 50 from one of the solar receivers (e.g., 810) to the other of the solar receivers (e.g., 820). Although only two solar receivers and a single tower are shown in FIG. 5, any number of solar towers and solar receivers can be used.

Figure 6:
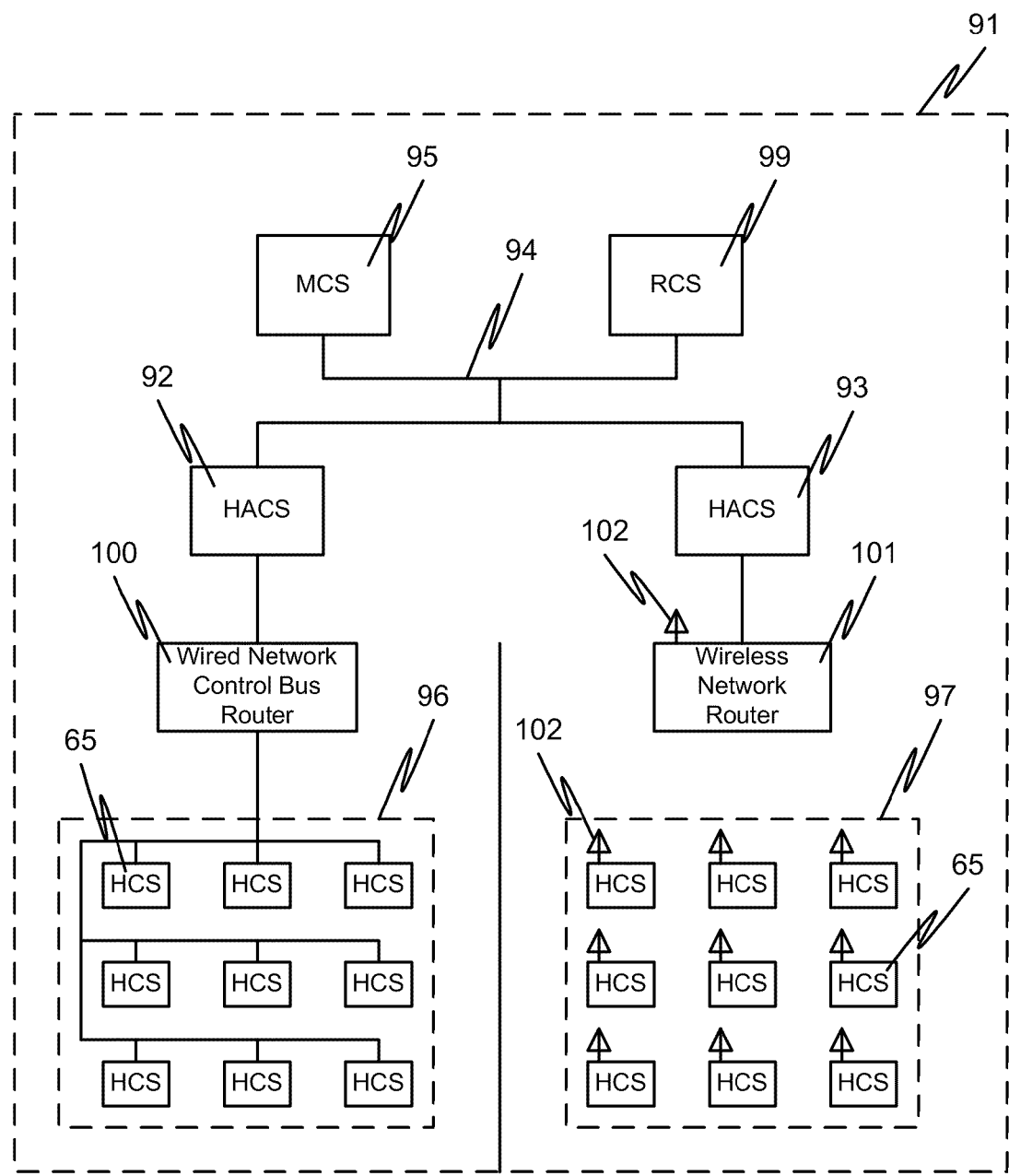
FIG. 6 is a schematic diagram of a heliostat control system, according to one or more embodiments of the disclosed subject matter.

Heliostats 70 in a field 60 can be controlled through a central heliostat field control system 91, for example, as shown in FIG. 6. For example, a central heliostat field control system 91 can communicate hierarchically through a data communications network with controllers of individual heliostats. FIG. 6 illustrates a hierarchical control system 91 that includes three levels of control hierarchy, although in other implementations there can be more or fewer levels of hierarchy, and in still other implementations the entire data communications network can be without hierarchy, for example, in a distributed processing arrangement using a peer-to-peer communications protocol.

At a lowest level of control hierarchy (i.e., the level provided by heliostat controller) in the illustration there are provided programmable heliostat control systems (HCS) 65, which control the two-axis (azimuth and elevation) movements of heliostats (not shown), for example, as they track the movement of the sun. At a higher level of control hierarchy, heliostat array control systems (HACS) 92, 93 are provided, each of which controls the operation of heliostats 70 (not shown) in heliostat fields 96, 97, by communicating with programmable heliostat control systems 65 associated with those heliostats 70 through a multipoint data network 94 employing a network operating system such as CAN, Devicenet, Ethernet, or the like. At a still higher level of control hierarchy a master control system (MCS) 95 is provided which indirectly controls the operation of heliostats in heliostat fields 96, 97 by communicating with heliostat array control systems 92, 93 through network 94. Master control system 95 further controls the operation of a solar receiver (not shown) by communication through network 94 to a receiver control system (RCS) 99.

In FIG. 6, the portion of network 94 provided in heliostat field 96 can be based on copper wire or fiber optics connections, and each of the programmable heliostat control systems 65 provided in heliostat field 96 is equipped with a wired communications adapter, as are master control system 95, heliostat array control system 92 and wired network control bus router 100, which is optionally deployed in network 94 to handle communications traffic to and among the programmable heliostat control systems 65 in heliostat field 96 more efficiently. In addition, the programmable heliostat control systems 65 provided in heliostat field 97 communicate with heliostat array control system 93 through network 94 by means of wireless communications. To this end, each of the programmable heliostat control systems 65 in heliostat field 97 is equipped with a wireless communications adapter 102, as is wireless network router 101, which is optionally deployed in network 94 to handle network traffic to and among the programmable heliostat control systems 65 in heliostat field 97 more efficiently. In addition, master control system 95 is optionally equipped with a wireless communications adapter (not shown).

When clouds pass between the sun and the heliostats, insolation is temporarily interrupted. As a result, the radiation reflected onto a solar receiver may differ from an ideal or expected flux distribution. This can result in local variations in temperature or flux that could damage the receiver. Moreover, the variations in flux can result in less than ideal operating conditions, for example, a reduction in steam produced or superheating steam temperature.

According to one or more embodiments of the disclosed subject matter, images representative of cloud shadows with respect to a field of heliostats can be used to adjust operation of a solar energy system. For example, images of a field of heliostats and shadows produced by the clouds can be obtained. Additionally or alternatively, images of the sky and clouds can be obtained. The images can be analyzed to determine a shading parameter. Based on the shading parameter, an operating parameter of the solar energy system can be changed or maintained. For example, the operating parameter may include aiming directions for one or more unshaded heliostats in the heliostat field. Cloud characteristics in addition to the location of the cloud shadow can be used in determining the shading parameter. Such characteristics can be used in determining if and/or how to change an operating parameter of the solar energy system. For certain cloud characteristics, it may be determined to maintain current operation of the solar energy system despite the shadow.

Figure 7:
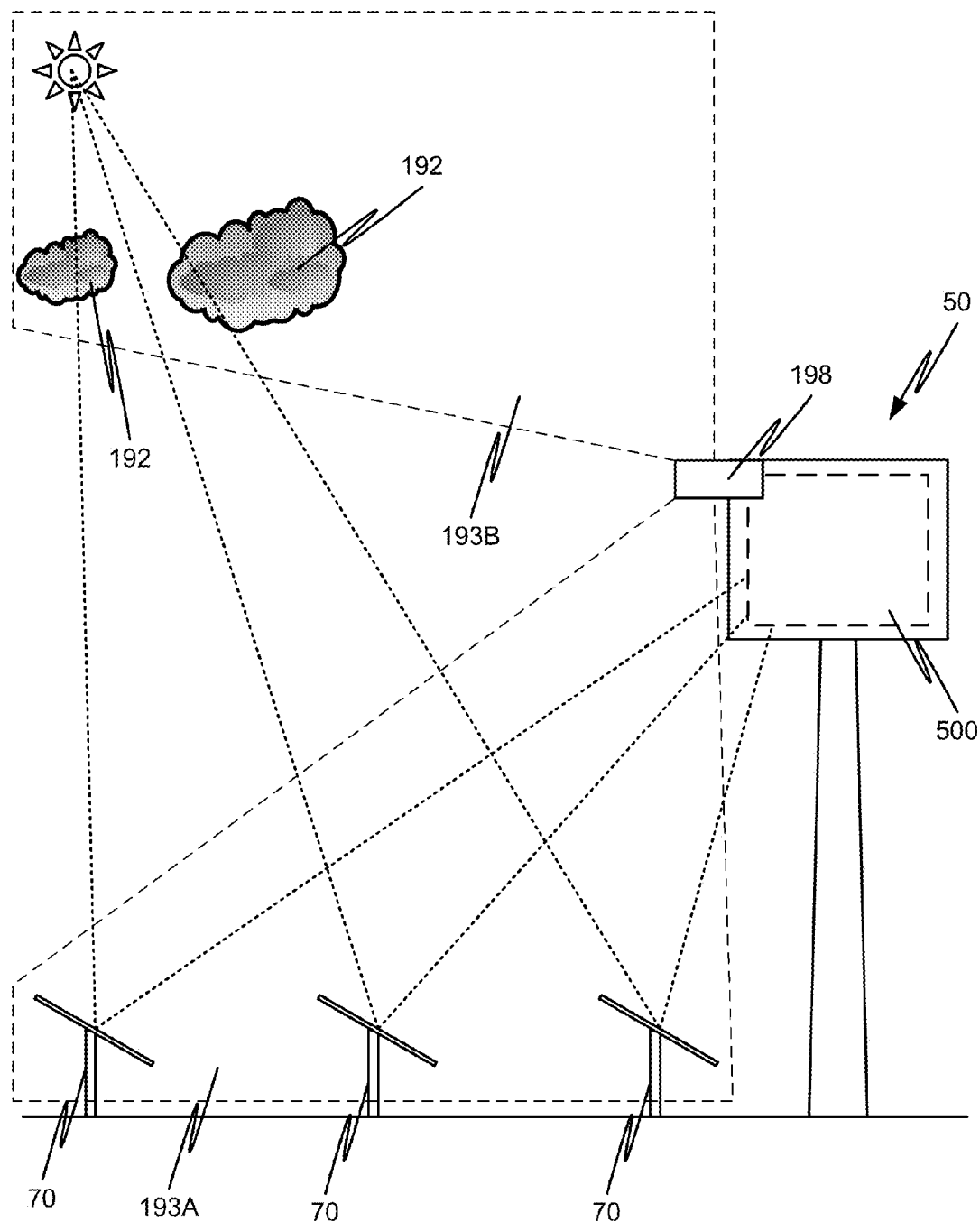
FIG. 7 shows a solar power tower system and a first imaging apparatus for cloud compensation, according to one or more embodiments of the disclosed subject matter.

In the embodiment of FIG. 7, a locally deployed imaging system 198 is arranged so as to acquire substantially local images indicative of cloud cover 192 over (or in the vicinity of) the field of heliostats 70. To obtain such images, the imaging device 198 can be arranged to image at least a portion of the field of heliostats, for example, by having a field of view 193A aimed at the ground, thereby obtaining images of shadows cast by passing clouds 192. Alternatively or additionally, the imaging device can be arranged to image at least a portion of the sky, for example, by having a field of view 193B, in order to determine the location of shadows in the field of heliostats. Embodiments may include combinations of imaging devices that are aimed at the field of heliostats and the sky.

Figure 8:
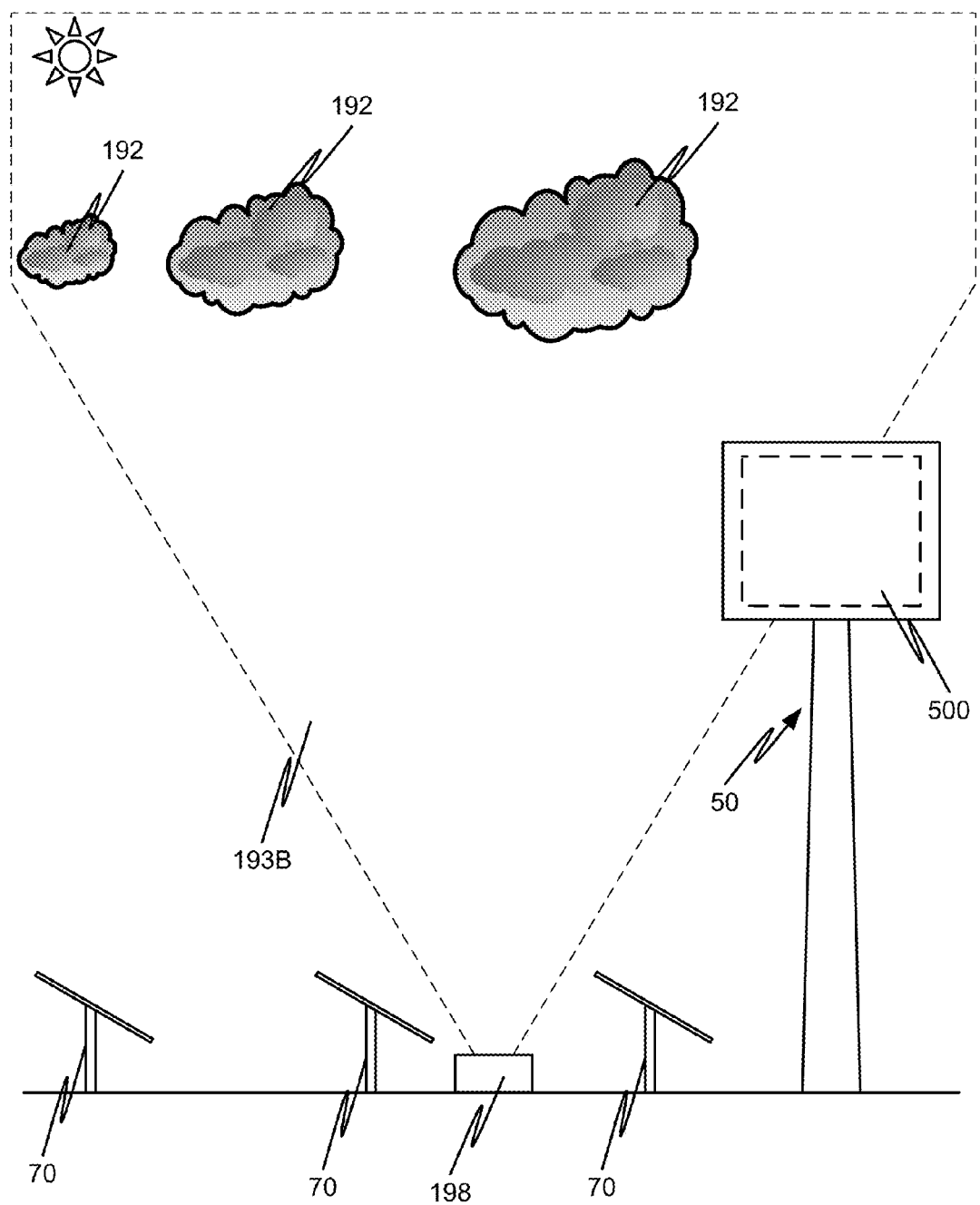
FIG. 8 shows a solar power tower system and a second imaging apparatus for cloud compensation, according to one or more embodiments of the disclosed subject matter.
Figure 9:
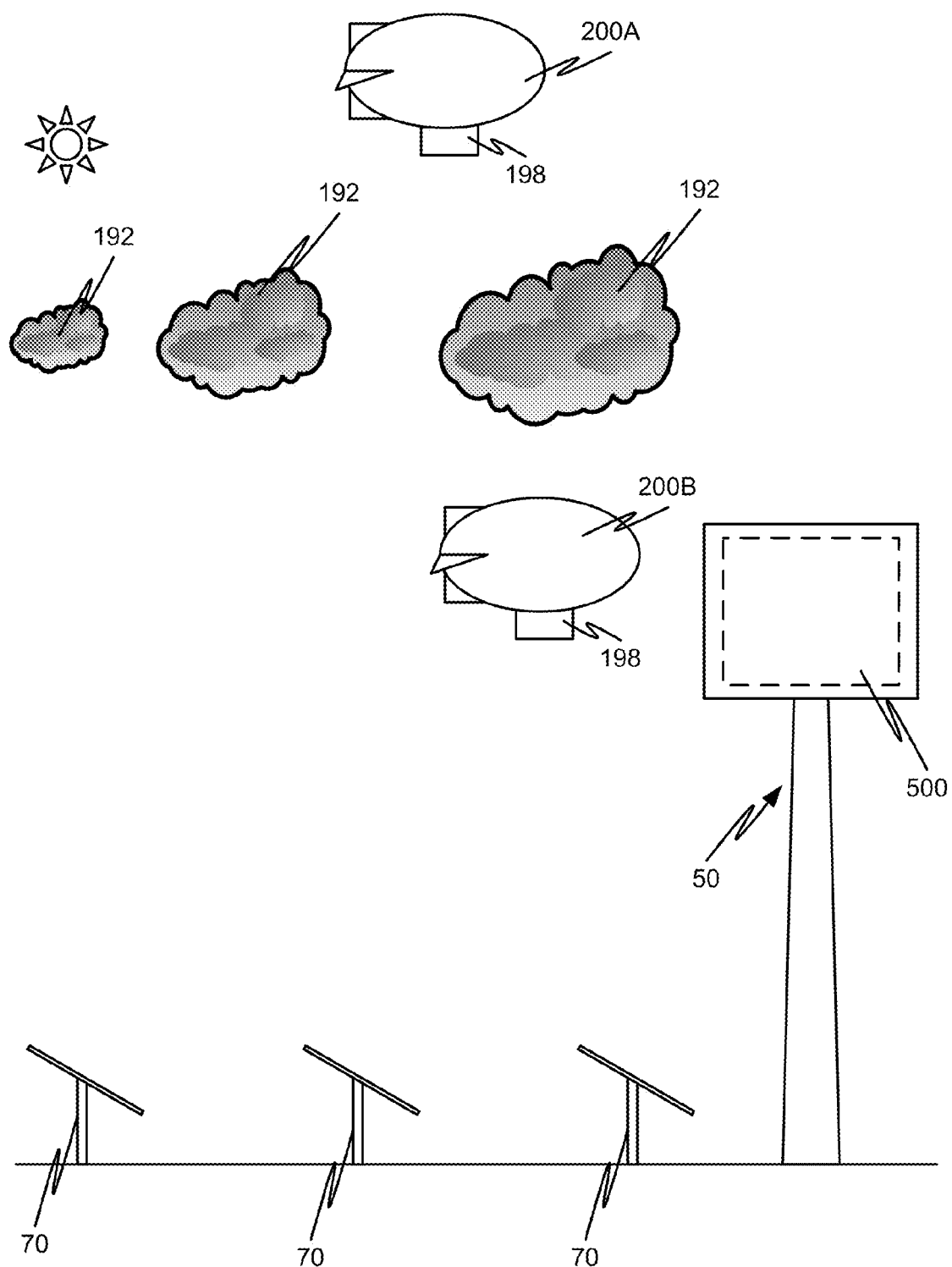
FIG. 9 shows a solar power tower system and a third imaging apparatus for cloud compensation, according to one or more embodiments of the disclosed subject matter.

As shown in FIG. 7, an imaging system may include one or more imaging devices 198 arranged on tower 50. For example, imaging device 198 can be a charge-coupled device (CCD), complementary metal oxide semiconductor (CMOS), or any other type of imager. The imaging device 198 can be arranged at or near the top of tower 50, for example, on or adjacent to the solar energy receiving system 500. Alternatively or additionally, one or more of the imaging devices 198 can be arranged on different towers, within the heliostat field (for example, see FIG. 8), above the heliostat field (for example, in an aircraft 200A above a layer of clouds or in an aircraft 200B below a layer of clouds, as shown in FIG. 9), or outside of the heliostat field (not shown). In some embodiments, the locally deployed imaging device 198 is a camera whose altitude is, for example, less than 5 km, or less than 1 km, or less than 500 m, or less than 100 m. The imaging device 198 can be arranged within the confines of the heliostat field, or at a distance from the heliostat field that is, for example, less than 20 km, or less than 10 km, or less than 5 km, or less than 500 m.

As shown in FIG. 7, the heliostat field can include one or more mirrors, for example, sun-tracking mirrors aimed at a target for heating a material therein using reflected insolation. For example, the heated material can be water, molten salt, or any other material. Heliostats 70 within the field can be aimed at a target, i.e., solar energy receiving system 500, mounted on tower 50.

The acquired images can be used to determine a shading parameter of the heliostat field. In addition, the imaging device 198 can be configured to provide one or more images at different times, for example, to provide time-lapse imaging. For example, the images from the one or imaging devices 198 can be analyzed by a processor (not shown) to determine the shading parameter which can then be used to determine the shading parameter. Examples of the shading parameter include but are not limited to (i) a subset of the heliostats in the field of heliostats that are substantially shaded by clouds or that are substantially free of cloud shade, (ii) the dimensions of one or more shadows that cover a fraction of the heliostat field, and (iii) relative shade strengths at one or more distinct locations within the field of heliostats.

Figure 10:
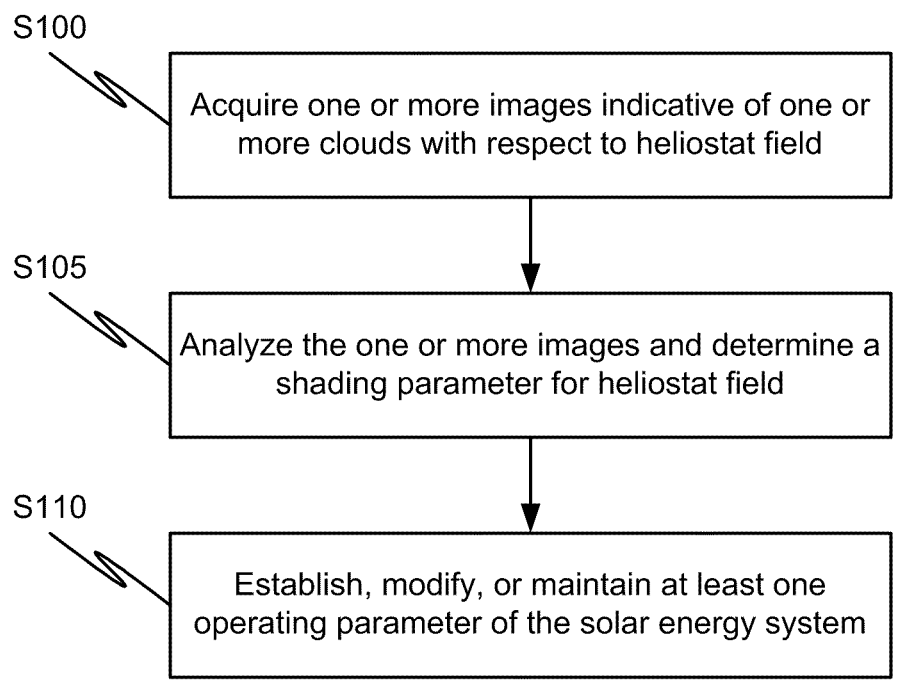
FIG. 10 is a process flow diagram for operating a solar energy system to account for cloud shading, according to one or more embodiments of the disclosed subject matter.

Turning to FIG. 10, a process flowchart illustrating an embodiment of an operating method for a solar energy system is shown. At S100, one or more imaging devices 198 are used to acquire one or more images indicative of cloud cover with respect to the heliostat field. For example, one or more of the imaging devices 198 can be aimed at portions of the heliostat field or portions of the ground surrounding the heliostat field in order to provide images of cloud shadows. In another example, one or more of the imaging devices 198 can be aimed at portions of the sky in order to provide images of clouds. The images of the clouds can then be correlated to respective shadows on the ground.

At S105, the acquired images can be analyzed by, for example, a processor to determine a shading parameter for the heliostat field. Examples of the shading parameter include but are not limited to (i) a subset of the heliostats in the field of heliostats that are substantially shaded by clouds or that are substantially free of cloud shade, (ii) the dimensions of one or more shadows that cover a fraction of the heliostat field, and (iii) relative shade strengths at one or more distinct locations within the field of heliostats. In addition, the shading parameter can reflect a prediction of cloud shadow location in addition to or in place of a real-time cloud shadow location.

Figure 12:
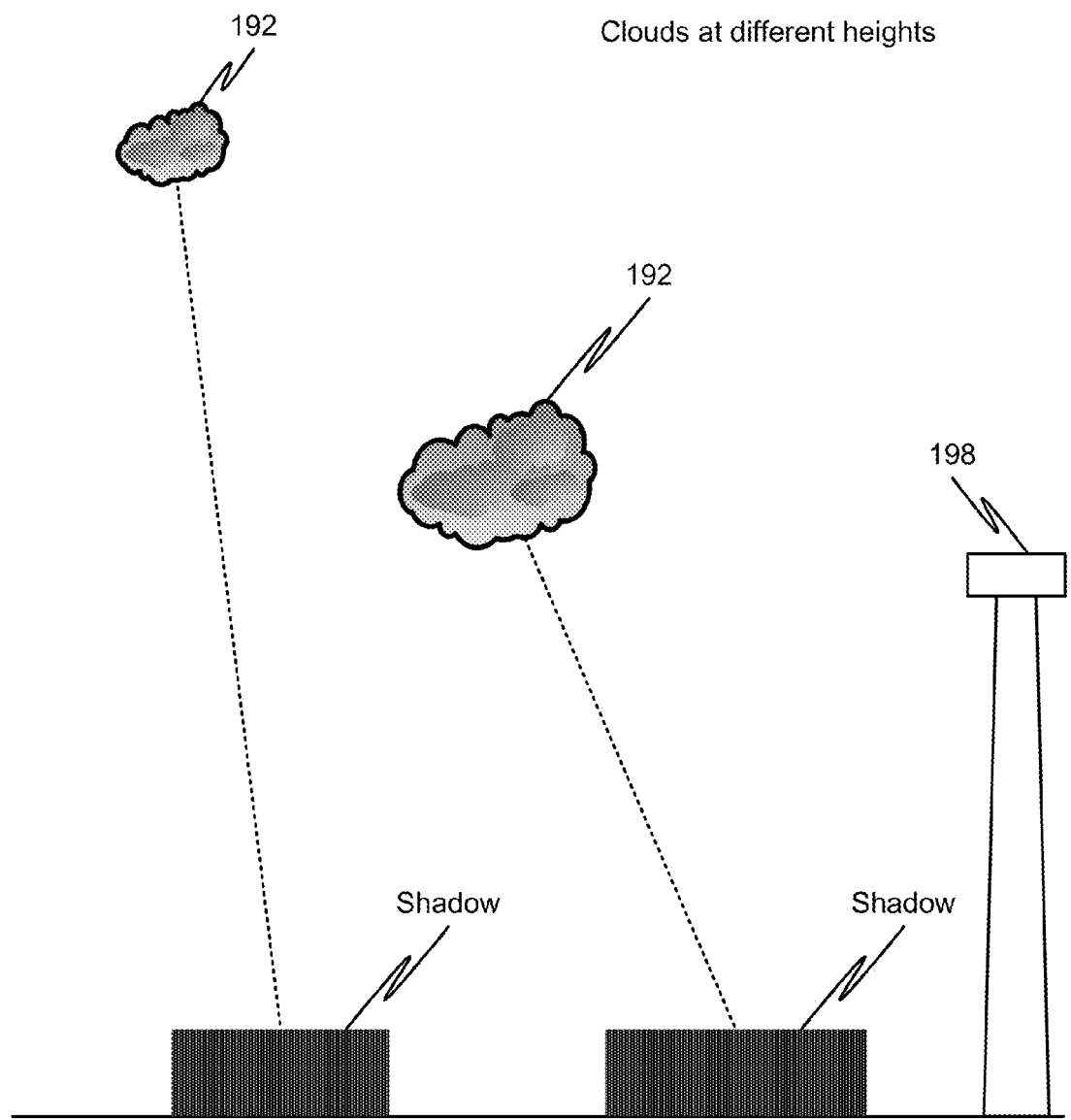
FIG. 12 shows cloud shadows created by clouds at different heights for evaluation by an imaging apparatus for cloud compensation, according to one or more embodiments of the disclosed subject matter.
Figure 13:
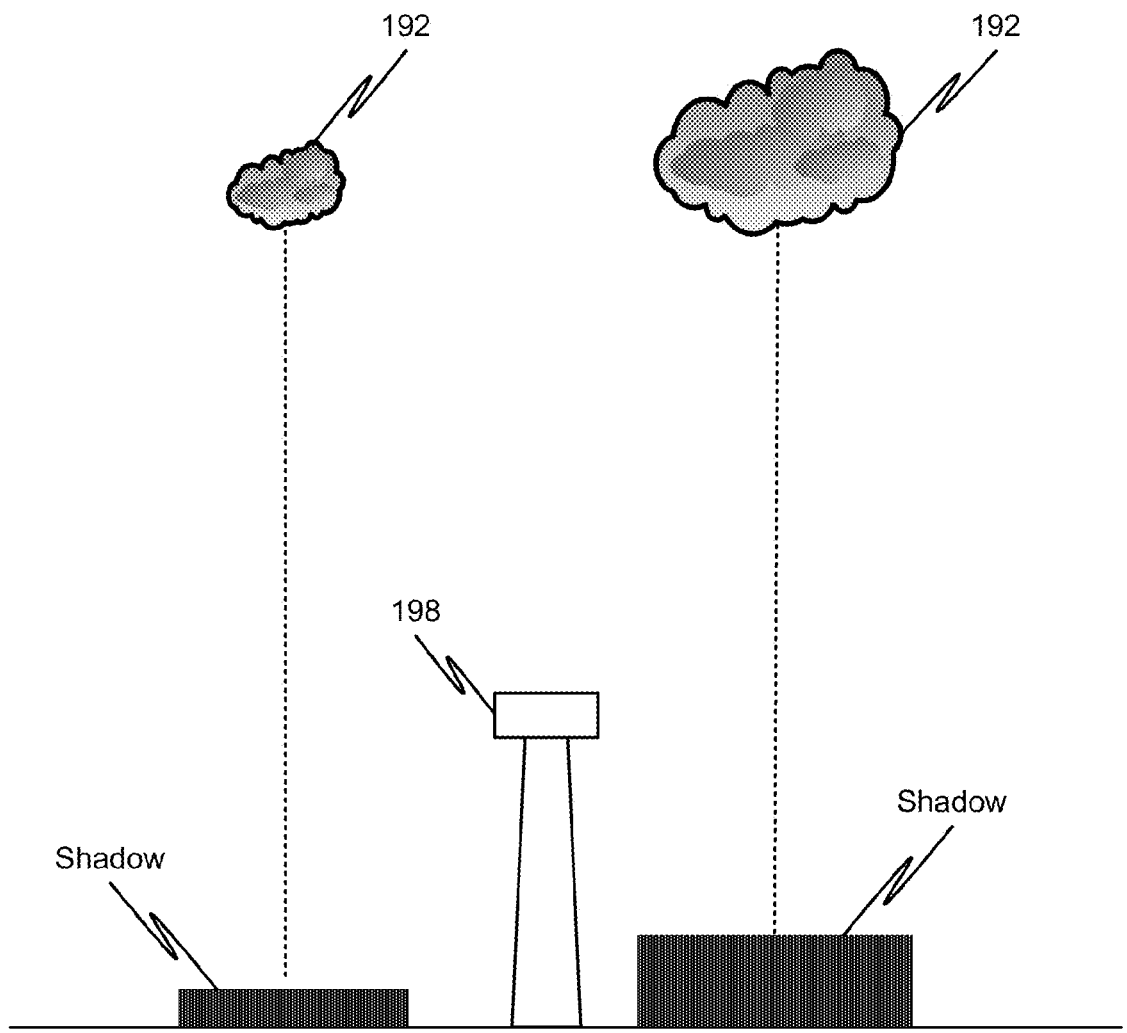
FIG. 13 shows cloud shadows created by clouds of different thicknesses for evaluation by an imaging apparatus for cloud compensation, according to one or more embodiments of the disclosed subject matter.
Figure 14:
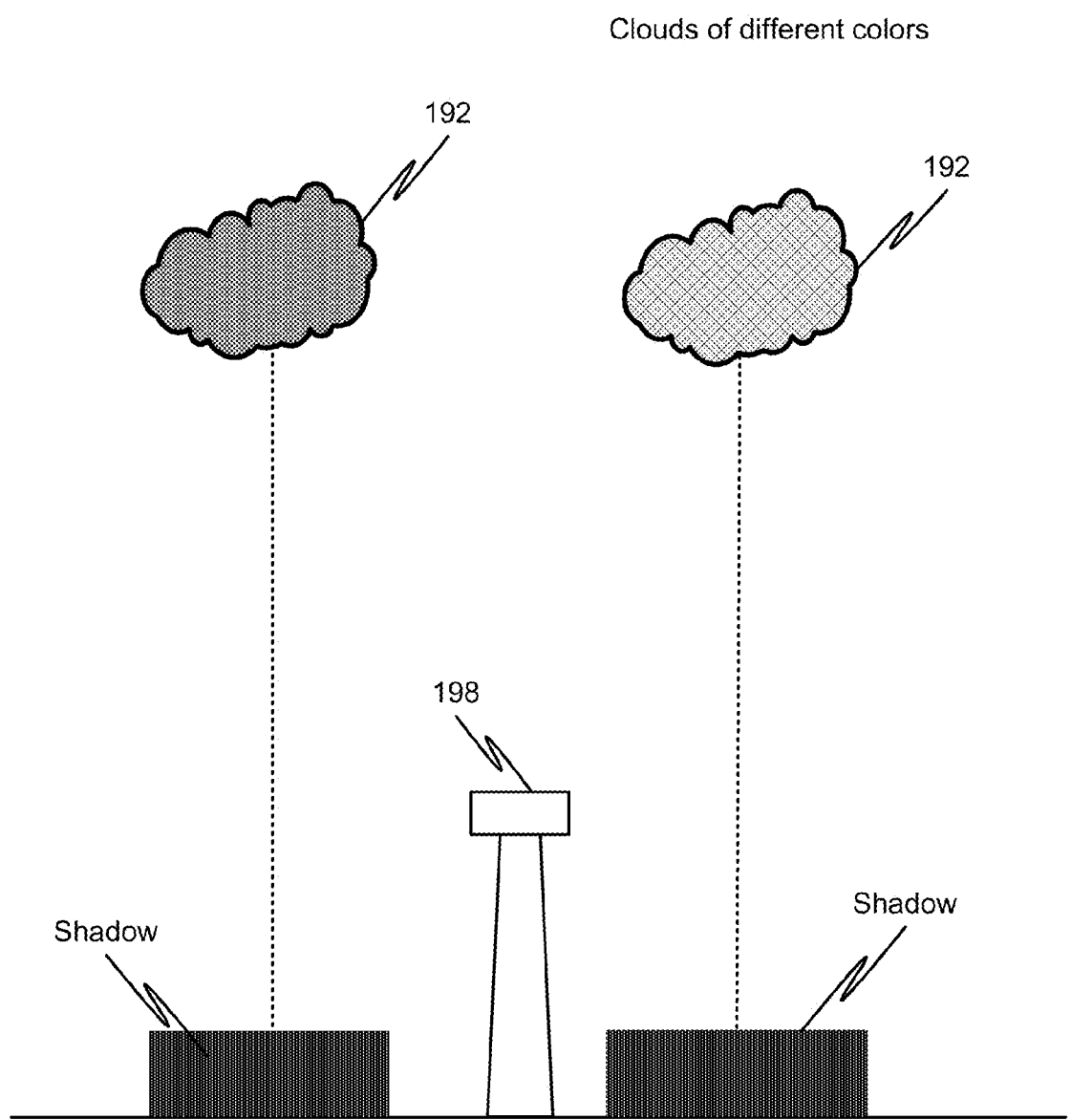
FIG. 14 shows cloud shadows created by clouds of different colors for evaluation by an imaging apparatus for cloud compensation, according to one or more embodiments of the disclosed subject matter.

The acquired images can be analyzed to determine useful information for carrying out S110. For example, the current or predicted location of a cloud-induced shadow location can be computed. As shown in FIG. 12, cloud height of each cloud 192 can be estimated from the acquired image. For example, imaging device calibration data can include extrinsic calibration data, which can be used to relate (i) a Euclidean distance between the imaging device and the cloud location to (ii) a pixel location of the cloud or a portion thereof. As shown in FIG. 13, cloud vertical thickness can be estimated from the acquired images. Imaging device calibration data and/or analysis of image from multiple imaging devices having different perspectives of the cloud can be used to estimate cloud thickness. As shown in FIG. 14, cloud texture and/or color pattern can be estimated from the acquired images. Color as used herein can include colors in the visible light spectrum and in the non-visible light spectrum, i.e., ultra-violet (UV) and infra-red (IR). The estimated cloud parameters can be used in determining the shading parameter, as described below.

Referring again to FIG. 10, at S110, the solar energy system can be operated according to the shading parameter. Operating parameters that can be regulated based on the shading parameter can include but are not limited to (i) an operating parameter of tower-based solar steam system, (ii) an operating parameter of a tower-based photovoltaic system, (iii) an operating parameter of a tower-based molten salt system, (iv) an operating parameter of a biofuel generation system, (v) an operating parameter of the heliostat field (e.g., heliostat aiming targets), and (vi) an operating parameter of another portion of the energy apparatus (e.g., a steam generation or molten salt apparatus).

Figure 11A:
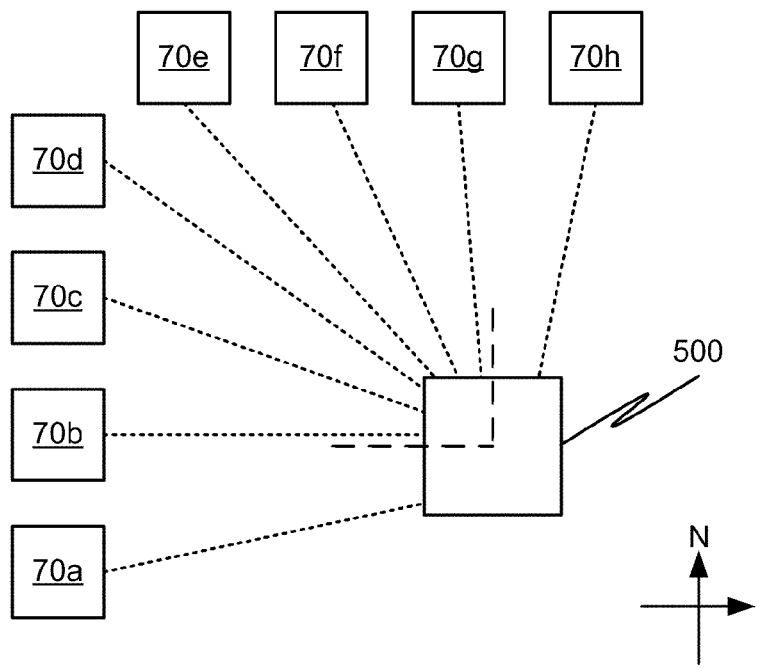
FIG. 11A is an aerial view of a receiver and a portion of a heliostat field of a solar energy system, according to one or more embodiments of the disclosed subject matter.

In an embodiment, the regulation of S110 can include adjusting heliostat aiming based on the determined shading parameter. Referring to FIG. 11A, an aerial view of a portion of heliostat field and a receiver are shown. Only eight heliostats have been illustrated for convenience; however, a practical embodiment of a heliostat field can include many more heliostats arranged. Heliostats 70a, 70b, 70c, and 70d are arranged in a western portion of the heliostat field and are configured to reflect solar radiation onto the western face of solar energy receiving system 500, at least in FIG. 11A. Heliostats 70e, 70f, 70g, and 70h are arranged in a northern portion of the heliostat field and are configured to reflect solar radiation onto the northern face of solar energy receiving system 500, at least in FIG. 11A. Insolation reflected onto the north face of solar energy receiving system 500 (or another of the faces) can be converted into another form of energy than insolation reflected onto the west face of solar energy receiving system 500 (or any of the other faces).

In FIG. 11A, none of the heliostats are shaded by passing clouds. Heliostats 70a-70d have "better views" of the west face of solar energy receiving system 500 than of the north face. That is, the angle between the beam of reflected light from the respective heliostats 70a-70d and the normal to the respective face of the target is smaller in the case of the west face than in the case of the north face. As such, heliostats 70a-70d are directed toward the west face and therefore reflect incident radiation thereon. Similarly, heliostats 70e-70h have "better views" of the north face of solar energy receiving system 500 than of the west face. As such, heliostats 70e-70h are directed toward the north face and therefore reflect incident radiation thereon.

Figure 11B:
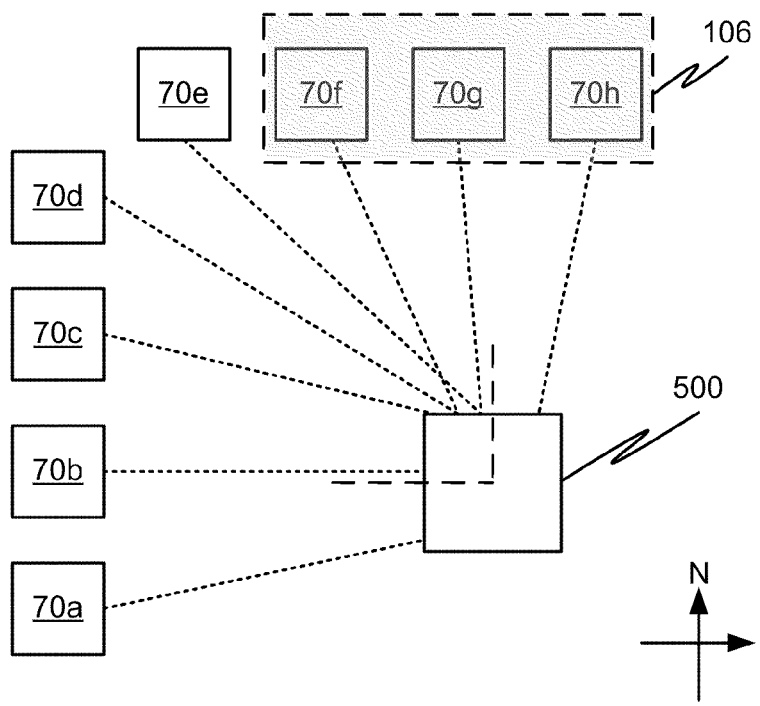
FIG. 11B shows the view of FIG. 11A with a portion of the heliostat field shaded by one or more clouds, according to one or more embodiments of the disclosed subject matter.

Such a case can apply when no cloud shadows obstruct solar radiation incident on the field of heliostats, as shown in FIG. 11A. However, when a cloud shades a portion of the heliostat field, the aiming points of the heliostats in the field may be re-arranged to compensate for the shadow. For example, in FIG. 11B, the processor may determine (or predict) from acquired photographs that heliostats 70f-70h in region 106 of the heliostat field are (or will be) shaded by clouds, while the other heliostats will enjoy relatively sunny conditions. In such a situation, the total amount of flux incident on the north face of solar energy receiving system 500 may be reduced to a greater extent than the total amount of flux incident on the west face. Accordingly, it may be advantageous in response to the detected shading (i.e., current conditions or predicted conditions) to re-aim heliostats 70c-70d from the west face to the north face to compensate for the reduced insolation flux on the north face.

Figure 11C:
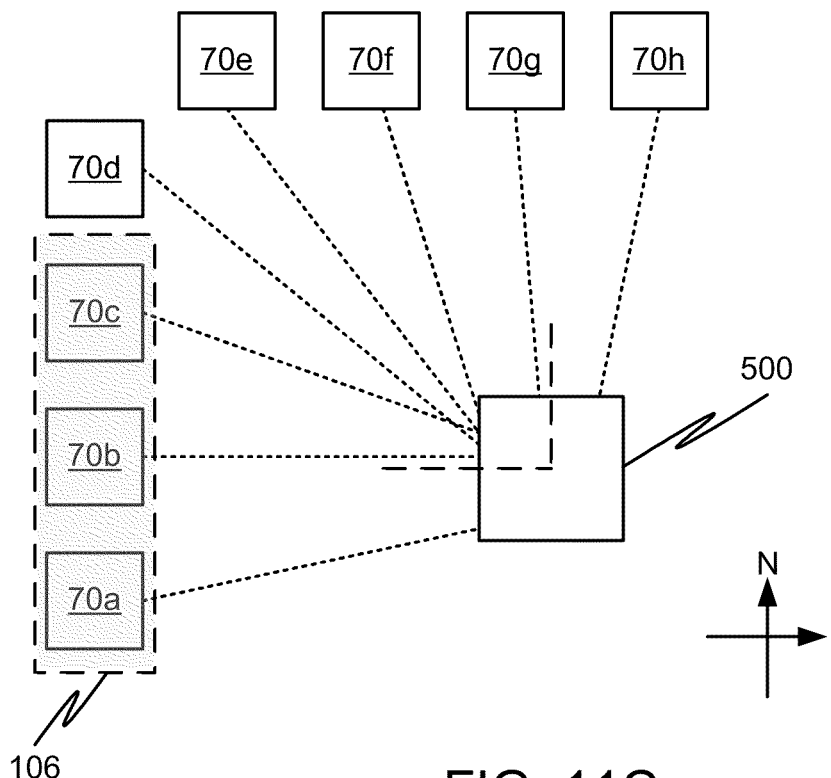
FIG. 11C shows the view of FIG. 11A with another portion of the heliostat field shaded by one or more clouds, according to one or more embodiments of the disclosed subject matter.

For example, in FIG. 11C, the processor may determine (or predict) from acquired photographs that heliostats 70a-70c in region 106 of the heliostat field are (or will be) shaded by clouds, while the other heliostats will enjoy relatively sunny conditions. In such a situation, the total amount of flux incident on the west face of solar energy receiving system 500 may be reduced to a greater extent than the total amount of flux incident on the north face. Accordingly, it may be advantageous in response to the detected shading (i.e., current conditions or predicted conditions) to re-aim heliostats 70e-70f from the north face to the west face to compensate for the reduced insolation flux on the north face.

Thus, in one or more embodiments, the operating the solar energy system according to the shading parameter can include modifying one or more aiming points of one or more heliostats, for example, to compensate for reduced insolation on one or more portions of the solar energy receiving system or on one or more solar receivers. For example, the modifying aiming points can be to maintain a uniform temperature or flux profile on a surface of one or more solar receivers. The modifying of the aim of each heliostat can include mechanically moving the heliostat aiming point to cause the projected heliostat beam to move from one face of the solar energy receiving system 500 in tower 50 to another face of the solar energy receiving system.

In an embodiment, the re-aiming of one or more heliostats can be an inter-tower aiming transition where the projected heliostat beam is moved from a first tower to a second tower, for example, in the multi-tower system of FIG. 4. In another embodiment, the re-aiming of one or more heliostats can include re-aiming from a receiver with a particular function to another receiver with another function. For example, the re-aiming can be from an evaporator (or steam generator) to a superheater. The different receivers can be located in the same tower (such as receiver 810 serving as an evaporator and receiver 820 serving as a superheater, as in FIG. 5). Alternatively, the different receivers can be different faces of the solar energy receiving system in a single tower. For example, the evaporator may be a north face of the receiving system 500 while the superheater may be a west face of the receiving system 500.

In an embodiment, the re-aiming of one or more heliostats may cause the respective beam projected therefrom to move only by a small distance at or near the top of the tower, for example, by less than 10 m, or less than 5 m, or less than 2 m. In another example, the heliostat aiming transition may be a supercritical steam generator-evaporator aiming transition.

Figure 15:
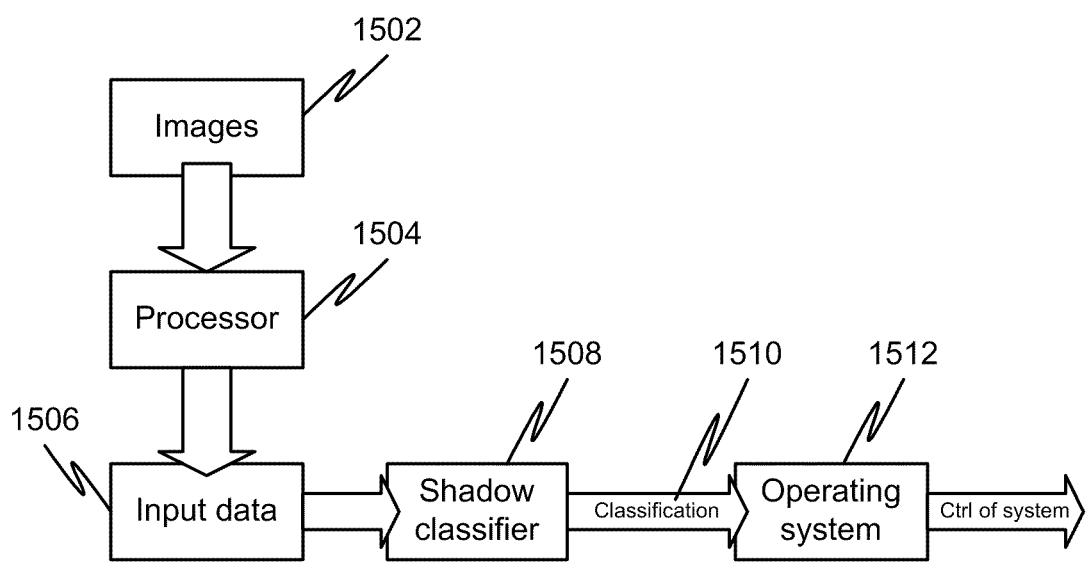
FIG. 15 is a schematic diagram illustrating a cloud classification system for cloud compensation, according to one or more embodiments of the disclosed subject matter.

Input data 1506 derived from the acquired images 1502 indicative of one or more cloud properties can be provided to a cloud classification module 1508 as shown in the embodiment of FIG. 15. For example, the input data 1506 can include one or more of the cloud parameters estimated by image processor 1504 and described with respect to FIGS. 12-14 above. The input data 1506 can include one or more parameters detectable from the images acquired in S100. In S105, the analysis can include classifying any given cloud or set of clouds according to estimated "shadowing strength" (e.g., strong or weak shadow) of the cloud-induced-ground-shadow's ability to block insolation from reaching the heliostat field. Alternatively, the shadowing strength can be a graded measure based on the amount of insolation able to pass through the cloud. The classifier 1508 can output 1510 the cloud classification to the operating system 1512 for use in operating the solar energy system. The classifier 1508 and/or processor 1504 and/or operating system 1512 can be implemented in any combination of hardware and/or software, for example, a computer executable code residing in volatile and/or non-volatile memory that is executed by a computer processor, such as a microprocessor.

Classifier 1508 can employ any machine learning and/or statistical artificial intelligence technique and/or other appropriate techniques known in the art, including but not limited to neural networks, Markov models, regression models, and the like. In embodiments, the input features 1506, which are detectable from the acquired images, can include but are not limited to cloud color, cloud texture, cloud shape, and/or cloud height. In addition, one or more cloud image features may be combined by classifier 1508 with other additional features not necessarily evident from the acquired images. For example, the classifier may take into account sun position, humidity, barometric pressure or any other feature in determining a cloud classification and/or shading parameter.

In embodiments, the cloud classifier can classify shadows as "strong" if they are likely to induce a strong shadow on the ground by virtue of, for example, their thickness and/or darkness. The cloud classifier can classify shadows as "weak" if it is likely that insolation from the sun is reduced to only a limited extent. Other cloud classifications are also possible.

Figure 16A:
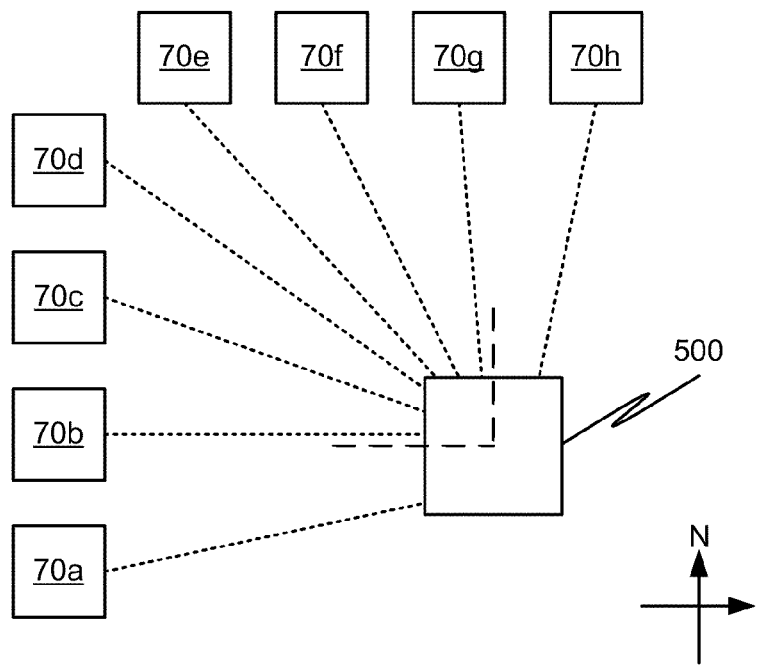
FIG. 16A is an aerial view of a receiver and a portion of a heliostat field of a solar energy system, according to one or more embodiments of the disclosed subject matter.
Figure 16B:
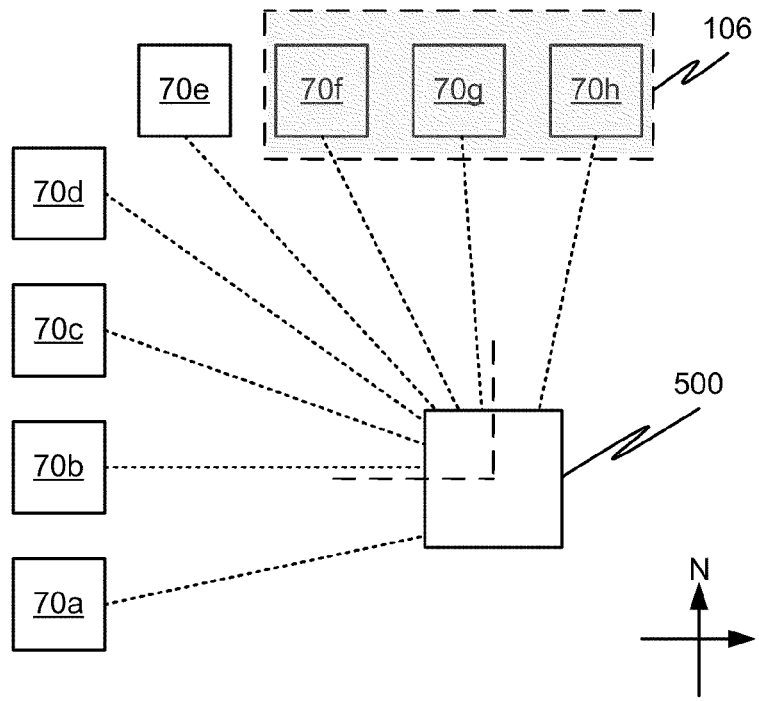
FIG. 16B shows the view of FIG. 16A with a portion of the heliostat field shaded by one or more clouds casting a weak shadow, according to one or more embodiments of the disclosed subject matter.
Figure 16C:
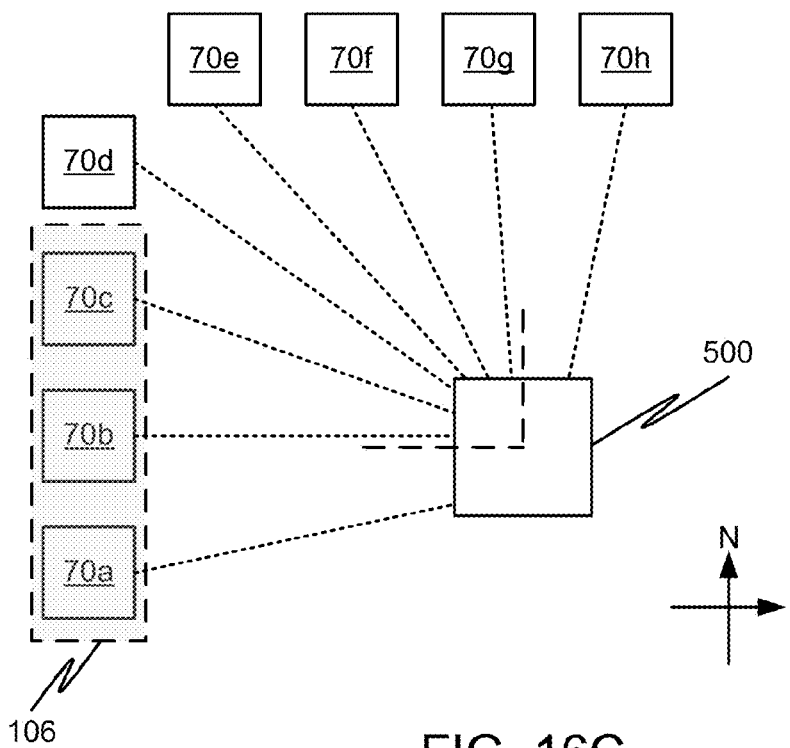
FIG. 16C shows the view of FIG. 16A with another portion of the heliostat field shaded by one or more clouds casting a weak shadow, according to one or more embodiments of the disclosed subject matter.

Referring not to FIGS. 16A-16C, an embodiment is shown in which the cloud classifier classifies a cloud as generating a weak shadow. In contrast to the strong cloud classification in the embodiment of FIGS. 11A-11C, when a cloud shades a portion of the heliostat field in FIGS. 16B-16C, the aiming points of the heliostats in the field may not be adjusted to compensate for the weak shadow. In other words, even if the same shadow locations are predicted/detected as in FIGS. 11B-11C, because the clouds are classified as weak (i.e., in S105), it may be preferable not to re-aim the heliostats. Thus, the re-aiming of heliostats or changing any of the other operating parameters of the solar energy system may be contingent upon the result of the cloud classification and/or contingent upon any input parameter to the classification model (e.g., cloud color, texture, and/or height) per the analysis in S105.

Although the above operating parameters related to heliostat field operating parameters, the available operating parameters are not limited thereto. In embodiments, the operating parameter of a portion of the solar energy system other than the heliostat field may be modified, established, and/or maintained according to the shading parameter. For example, the north surface of the tower can have an evaporator/boiler and the south surface of the tower can have a superheater. In the event that the acquired image indicates that the heliostats that typically reflect insolation to the north end are shaded or about to be shaded, without substantial shade to the south side where the superheater is, then it may be advantageous to inject steam into a steam separation drum deployed between the boiler and the superheater. In the event that the acquired image indicates that the heliostats that typically reflect insolation to the south end are shaded or about to shaded, without substantial shade to the north side where the evaporator/boiler is, then it may be advantageous to lower a turbine operating pressure, for example, in advance of the shadow.

Figure 17A:
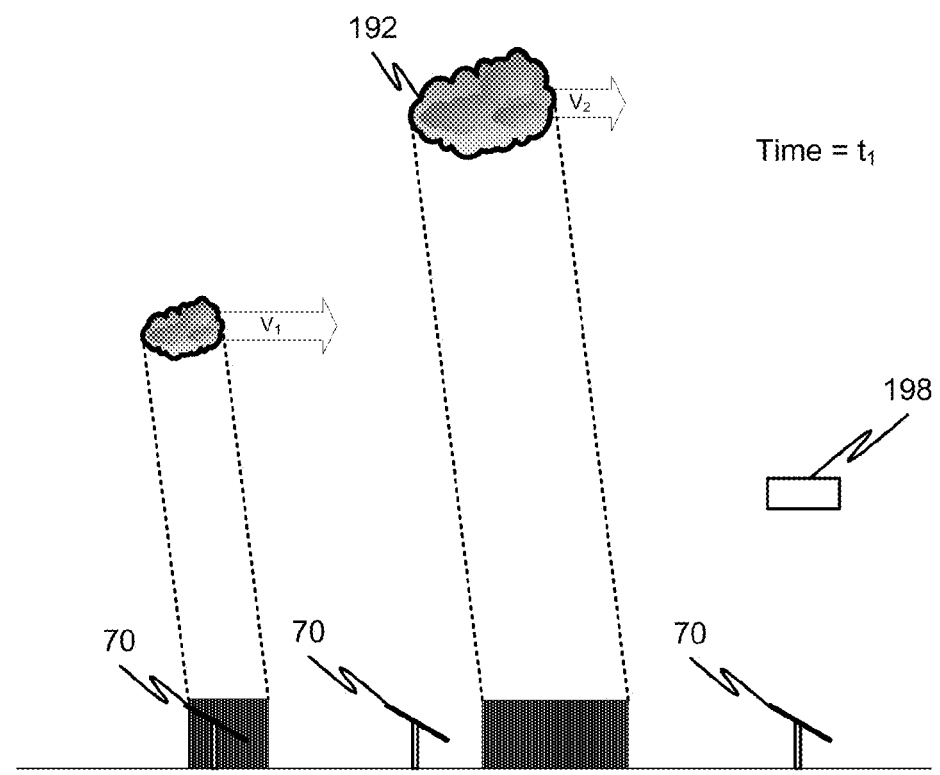
FIG. 17A shows cloud shadows created by moving clouds at a first time for evaluation by an imaging apparatus for cloud compensation, according to one or more embodiments of the disclosed subject matter.
Figure 17B:
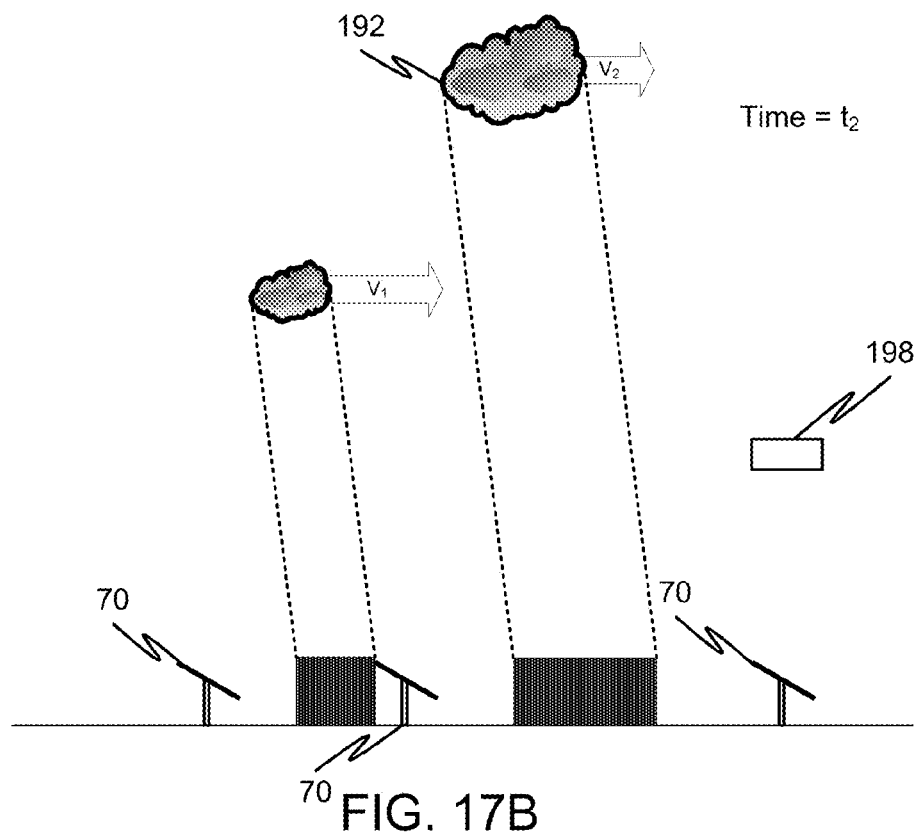
FIG. 17B shows cloud shadows created by moving clouds at a second time for evaluation by an imaging apparatus for cloud compensation, according to one or more embodiments of the disclosed subject matter.
Figure 17C:
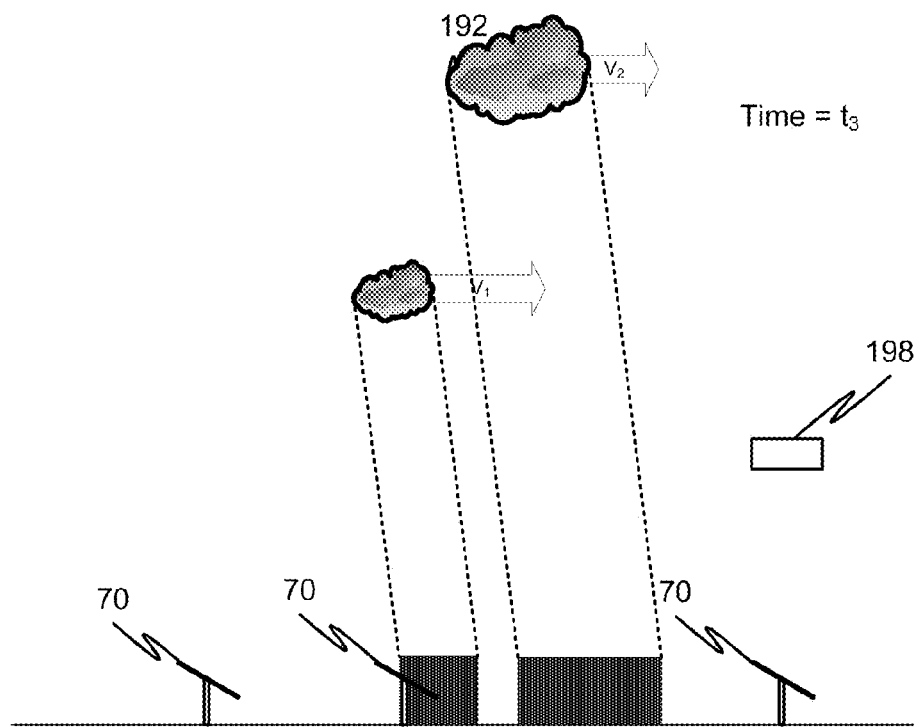
FIG. 17C shows cloud shadows created by moving clouds at a third time for evaluation by an imaging apparatus for cloud compensation, according to one or more embodiments of the disclosed subject matter.

In embodiments, it is possible to acquire a time series of images to estimate a trajectory of one or more clouds, for example, as illustrated in FIGS. 17A-17C. The time series images can help predict a future shadow status with respect to the heliostat field. Accordingly, in S105, the shading parameter can include a future shading parameter, and, in S110, the operating can be carried out preemptively. In embodiments, the pre-emptive operation can be related to fossil-fuel derived steam. For example, in the event that the cloud image analysis indicates that an evaporator region of the heliostat field (i.e., a region of the heliostat field where the heliostats are aimed at an evaporator section of the receiver) is about to be shaded within a designated period of time, then it may be advantageous to initiate a natural gas boiler to be on-call for when natural-gas-derived steam is injected into the steam separation drum associated with the evaporator/boiler.

In embodiments, a pre-emptive operation relates to re-aiming of heliostats. Because heliostats may need a certain amount of travel time to re-aim, then it may be advantageous in anticipation of predicted or future shade conditions to re-aim before the heliostat becomes shaded.

Figure 18A:
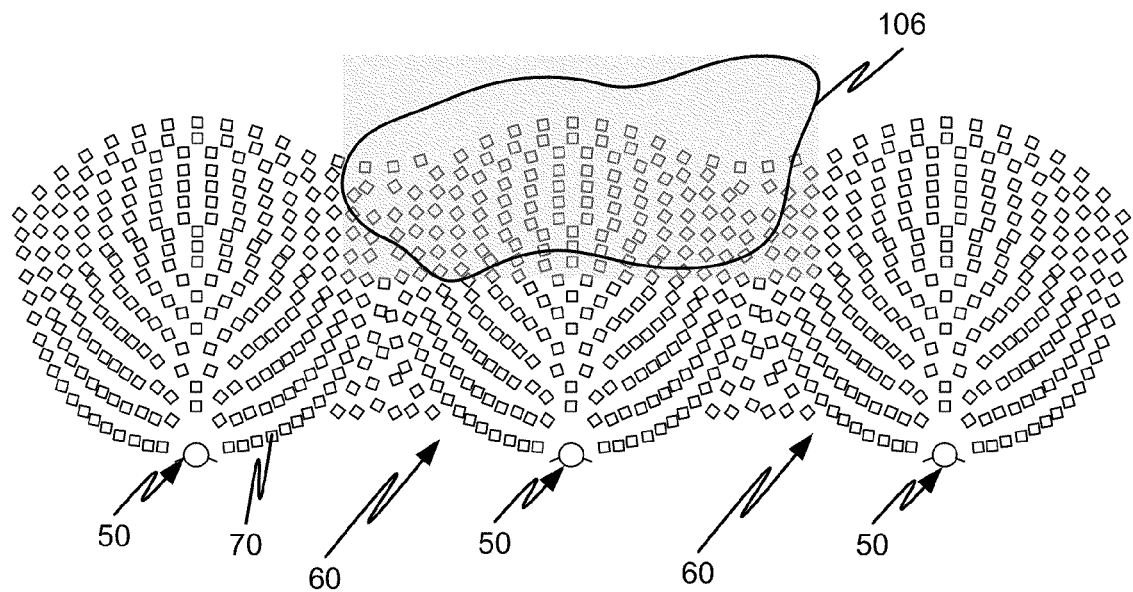
FIG. 18A shows an aerial view of a cloud shadow at a first time moving across a heliostat field with multiple solar towers, according to one or more embodiments of the disclosed subject matter.
Figure 18B:
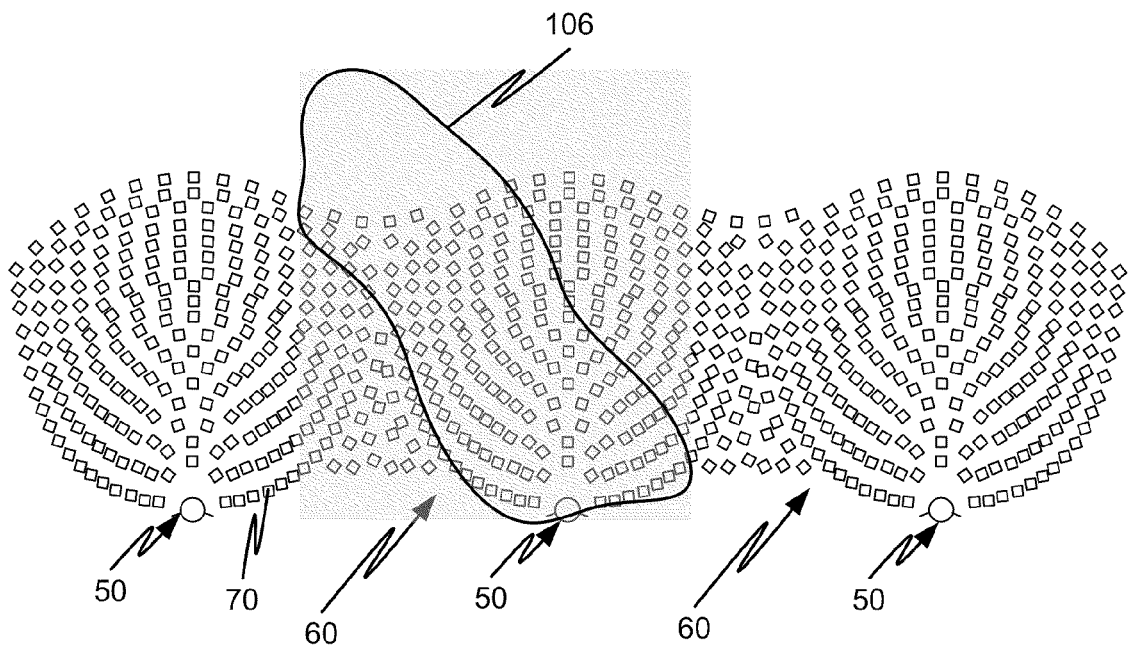
FIG. 18B shows an aerial view of a cloud shadow at a second time moving across a heliostat field with multiple solar towers, according to one or more embodiments of the disclosed subject matter.

In embodiments, a location of a shadow at or near ground level produced by a cloud in the sky and/or a shape or size of a shaded region at or near ground level produced by the cloud is determined. For example, movement of a shadow 106 as it moves across heliostats 101 in a system with multiple towers 102 can be tracked, as shown in FIGS. 18A-18B. Characterization of such movement can include determining a shape of the shadow, a translational velocity of the shadow, and/or a rotational velocity of the shadow so as to determine and/or predict movement of the cloud shadow with respect to the field of heliostats or other components of the solar energy system. The determined shadow can depend upon a number of factors, including but not limited to the position of the sun as determined in advance from astronomical data, such as day of the year, time of day, and geographic location.

In embodiments, a physical location of the cloud or a portion thereof can be estimated from imaging device calibration data (e.g., including extrinsic data) or according to any other method known in the art. The imaging device calibration data can relate each pixel location of the imaging device and/or any images produced by the imaging device with a real-world location in space. The location of the cloud-generated shadow can be estimated according to the location in the sky of the sun at a given moment and the real world location of the cloud as estimated from the image, for example, by using ray-tracing or any other known techniques known in the art.

In embodiments, the location of the shadow on the ground caused by the cloud can be measured from one or more of the acquired images. For example, imaging devices, such as photodetectors, may be arranged on the ground at various locations. Alternatively or additionally, the imaging devices can be directed at the ground at various locations. This may be carried out for a number of known sun positions (i.e., computed according to latitude, time of day, day of year) and a number of cloud positions (i.e., either determined by pixel position within the acquired electronic image or according to real world position of the cloud or a portion thereof). The data gathering phase may be useful for characterizing a relationship between cloud position, sun position, and shadow position.

In embodiments, the data does not necessarily need to be gathered for every possible cloud position and sun position. However, statistical, interpolation, or other techniques can be utilized to compute a predicted shadow position for a sun position and cloud position where the outcome shadow position has not necessarily been measured. Thus, the shadow position for an unknown sun position/cloud position combination may be based upon measured known shadow positions for known sun position/cloud position combinations.

In embodiments, the operating the solar energy system can include commencing (or increasing) or concluding (or decreasing) a dumping operation. A dumping operation can occur when one or more heliostats in the heliostat field are re-aimed so that incoming insolation is reflected away from any solar target rather than onto a solar target. A dumping operation may be carried out in order to prevent the total amount of reflected insolation incident at a solar target or a portion thereof from exceeding the maximum permitted by the manufacture of the solar target.

In embodiments, the number of heliostats in dump mode can be reduced in response to analysis of clouds indicating that an area is about to become shady. Those heliostats can thus be redirected to the tower, e.g., a solar receiver at or near the top of the tower. The redirection could help compensate for the current or predicted drop in sunlight due to cloud-induced shading. This relates to concluding a dumping operation for one or more heliostats.

In embodiments, the acquired images may indicate that a region of heliostats normally aimed at the evaporator is about to be shaded and that a region of heliostats normally aimed at the superheater is not shaded and will remain sunny. Thus, a dumping operation for heliostats normally aimed at the superheater can be effected to avoid a situation where too small of a volume of steam (due to current or predicted deprivation of solar insolation from the evaporator) enters the superheater, which is subjected to full solar insolation. Such a condition may cause local overheating and/or material fatigue at the superheater. Thus, it may be advantageous to selectively dump only the superheater region of the heliostat field in response to the current or predicted shading concentrated in the evaporator region of the heliostat field.

In embodiments, a method of operating a solar energy system including a heliostat field can include (a) using an array of one or more locally deployed imaging devices to acquire images of one or more clouds, (b) analyzing content of the images to determine a shading parameter for the heliostat field or a portion thereof, and (c) in response to the content analysis, establishing, modifying, or maintaining at least one operating parameter of the solar energy system. The operating parameter can be selected from the group consisting of: (i) an operating parameter of a tower-based solar steam system; (ii) an operating parameter of a tower-based photovoltaic system; (iii) an operating parameter of a tower-based molten salt system; (v) an operating parameter of a biofuel generation system. The shading parameter can define at least one of: (i) a sub-plurality of a plurality of heliostats that are substantially shaded by clouds or that are substantially free of cloud shade; (ii) the dimensions of one or more shadows that cover a fraction of the solar field; and (iii) relative shade strengths at a plurality of distinct locations within the solar field.

In embodiments, the shading parameter can be a current shading parameter or a forecast shading parameter. Thus, it is possible to derive from one or more image(s) of clouds either a current shadow situation (i.e., shadows caused by the clouds) or a predicted or forecast shadow situation—this may be carried out using any technique (for example, using any image processing technique) known in the art.

In some embodiments, i) the image acquiring of step (a) includes acquiring a temporal array of images each image associated with a different respective image acquisition time; and ii) the forecast fractional shading parameter is determined in step (b) according to a function of images of temporal array of images and time differences between the image acquisition times. In some embodiments, the forecast shading parameter is determined according to at least one of a cloud size, a cloud height, and an estimated wind speed. In some embodiments, the analysis includes estimating or determining a thickness or opaqueness of cloud.

In some embodiments, the analyzing includes estimating at least one of a cloud weight, a cloud length, a cloud width and a cloud-cloud distance. The analysis may be carried out using information from the electronic images acquired by the locally-deployed camera. Alternatively, the analysis may be carried out in accordance with any additional information. Possible additional information includes but is not limited to radar information, laser information, and sun-tracking information.

In some embodiments, the electronic camera is oriented substantially at or above the horizon. In some embodiments, the electronic camera includes a fisheye lens or wide-angle lens and the electronic images are acquired via a fisheye lens or wide-angle lens of the electronic camera. In some embodiments a single electronic camera is deployed to capture the entire visible sky from horizon to horizon, either in a single image taken through a fisheye lens or a wide-angle lens, or by means of a mechanical pivoting device or turntable that allows the camera to capture a series of images that aggregately cover substantially the entire sky from horizon to horizon. In other embodiments a plurality of cameras is deployed in order to capture images of the entire visible sky.

In some embodiments, camera(s) may include an array of photodetectors, for example, CCD detectors or CMOS detectors. Camera(s) may be configured to generate an electronic image from any wavelength of light, including but not limited to visible light, ultraviolet (UV) light and infrared (IR) light.

In some embodiments, the step of establishing, modifying or maintaining the at least one operating parameter includes modifying a heliostat aim, for example, in a tower-based system or in a biofuel generation system. In some embodiments, the heliostat aim is modified to effect at least one aiming transition selected from the group consisting of: i) an inter-tower aiming transition; ii) an evaporator-superheater aiming transition; and iii) a supercritical steam generator-evaporator aiming transition. In some embodiments, the step of establishing, modifying or maintaining the at least one operating parameter includes modifying a sun-tracking-aim target (i.e. a target at which the heliostat is aimed while tracking the sun so the centroid of the heliostat's beam projection on the target remains at a substantially constant location) of a projected heliostat beam from a first location at or near the top of a solar tower to a second location at or near the top of the solar tower.

In one example, rather than radically modifying the aim angle of any given heliostat, it is sufficient to "nudge" (i.e. slightly modify) the heliostat from the first aiming location to the second aiming location—e.g., in a manner that modifies the target location (e.g. in a tower whose height is at least 25 m or 50 m or 100 m) of the centroid of the heliostat beam of reflected insolation by a 'small distance'—i.e. between at least 5 cm or 10 cm or 20 cm or 50 cm or 1 m and at most 10 m or 5 m or 2 m.

In some embodiments, the step of establishing, modifying or maintaining the at least one operating parameter includes commencing or concluding an insolation dumping operation for one or more sun-tracking mirrors. In some embodiments, the step of establishing, modifying or maintaining the at least one operating parameter includes modifying a number of heliostats aimed at a target at or near the top of a solar tower or modifying a total aggregate multi-heliostat flux of insolation directed at the target at or near the top of a solar tower. In some embodiments, the step of establishing, modifying or maintaining the at least one operating parameter includes increasing or decreasing a temperature of an external energy conversion device such as a heater, boiler, chiller or condenser. In some embodiments, the step of establishing, modifying or maintaining the at least one operating parameter includes modifying a turbine operating parameter.

In embodiments, a solar energy system can include a solar field configured to reflect insolation onto one or more targets, an array of one or more electronic cameras configured to acquire one or more electronic images of at least one cloud, and electronic circuitry operative to analyze contents of the electronic image(s) of the cloud(s) to determine a shading parameter for the solar field or a portion thereof and in response to the content analyzing, establish, modify or maintain at least one operating parameter of the solar energy system.

In embodiments, a method of operating a solar energy system including a solar field can include using an array one or electronic locally-deployed cameras to acquire one or more electronic images of a shadow(s) generated by one or more clouds, detecting, determining or receiving at least one of the cloud/shadow movement parameter which in conjunction with and/or not in conjunction with the electronic image(s) describes movement of one or more cloud movement and shadow movement, analyzing the combination of the image of the shadow(s) as well as the cloud/shadow movement parameter, and in response to the analyzing of the image and the cloud/shadow movement parameter, establishing, modifying or maintaining at least one operating parameter of the solar energy system.

In some embodiments, the cloud/shadow movement parameter is selected from the group consisting of a measured wind speed, a forecast wind speed, a measured cloud speed, a forecast cloud speed, a barometric pressure and air humidity. In some embodiments, the image acquiring of step (a) including acquiring a time series of at least two images, and the cloud/shadow movement parameter is a time gap between acquisition times of two different images of the time series.

In some embodiments, the electronic image is an image of a cloud shadow at a location outside of a solar field. In some embodiments, the electronic image is an image of a cloud shadow within the solar field.

In embodiments, a solar energy system can include a solar field configured to reflect insolation onto one or more targets, an array of one or more electronic cameras configured to acquire one or more electronic images of a shadow(s) generated by one or more clouds, and electronic circuitry operative to store a cloud/shadow movement parameter which in conjunction with and/or not in conjunction with the electronic image(s) describes movement of one or more cloud movement and shadow movement analyze the combination of the image of the shadow(s) as well as the cloud/shadow movement parameter, in response to the analyzing of the image and the cloud/shadow movement parameter, establishing, modifying or maintaining at least one operating parameter of the solar energy system.

In some embodiments, the solar field is configured to re-direct insolation so that the re-directed insolation heats a working fluid. In some embodiments, the solar field is configured to re-direct insolation to cause the insolation to be incident on a photo-electric surface to generate electricity. In some embodiments, the target is a biofuel generation target.

It is further noted that any of the embodiments described above may further include receiving, sending or storing instructions and/or data that implement the operations described above in conjunction with the figures upon a computer readable medium. Generally speaking, a computer readable medium may include storage media or memory media such as magnetic or flash or optical media, e.g. disk or CD-ROM, volatile or non-volatile media such as RAM, ROM, etc. as well as transmission media or signals such as electrical, electromagnetic or digital signals conveyed via a communication medium such as network and/or wireless links.

Although clouds are explicitly discussed above, the embodiments discussed herein are also applicable to any other transient obstructions between the sun and the heliostat field. For example, flying aircraft such as airplanes, helicopters, blimps, etc. can also cast shadows that would interfere with heliostat performance. Accordingly, the embodiments discussed herein may be used to compensate for these shadows as well.

Features of the disclosed embodiments may be combined, rearranged, omitted, etc., within the scope of the present disclosure to produce additional embodiments. Furthermore, certain features may sometimes be used to advantage without a corresponding use of other features.

It is, thus, apparent that there is provided, in accordance with methods and apparatus for operating a solar energy system to account for cloud shading. Many alternatives, modifications, and variations are enabled by the present disclosure. While specific embodiments have been shown and described in detail to illustrate the application of the principles of the invention, it will be understood that the invention may be embodied otherwise without departing from such principles. Accordingly, Applicant intends to embrace all such alternatives, modifications, equivalents, and variations that are within the spirit and scope of the present invention.

The invention claimed is:

1. A method of operating a solar energy system having a field of heliostats, the method comprising:
   acquiring at least one image of at least a portion of the field of heliostats;
   based on said at least one image, determining a first sub-portion of the field of heliostats shaded by one or more clouds; and
   based on said determining, changing an aiming direction of one or more of the heliostats outside of the first sub-portion.

2. The method of claim 1, further comprising, maintaining a respective aiming direction of at least one heliostat in the first sub-portion based on said determining.

3. The method of claim 1, wherein the changing includes re-aiming the one or more heliostats at different aiming points on a same receiver of the solar energy system.

4. The method of claim 1, wherein the changing includes re-aiming the one or more heliostats from respective first aiming points on a first receiver to second aiming points on a second receiver.

5. The method of claim 4, wherein the first receiver is on a same tower as the second receiver.

6. The method of claim 4, wherein the first receiver is on a different tower from the second receiver.

7. The method of claim 1, wherein the solar energy system is one of a tower-based solar steam system, a tower-based photovoltaic system, a tower-based molten salt system, and a biofuel generation system.

8. The method of claim 1, wherein the changing includes re-aiming at least one of the one or more heliostats from respective aiming points on a first receiver away from the first receiver.

* * * * *